(12) United States Patent
Matsuo et al.

(10) Patent No.: US 8,456,080 B2
(45) Date of Patent: Jun. 4, 2013

(54) DISPLAY DEVICE FOR DETECTING MISREGISTRATION AND WIDTH VARIATION AND METHOD OF MANUFACTURING SAME

(75) Inventors: Keisuke Matsuo, Kanagawa (JP); Kohji Hanawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 192 days.

(21) Appl. No.: 13/057,020

(22) PCT Filed: Jul. 29, 2009

(86) PCT No.: PCT/JP2009/063461
§ 371 (c)(1),
(2), (4) Date: Feb. 1, 2011

(87) PCT Pub. No.: WO2010/016412
PCT Pub. Date: Feb. 11, 2010

(65) Prior Publication Data
US 2011/0133636 A1    Jun. 9, 2011

(30) Foreign Application Priority Data
Aug. 8, 2008    (JP) ................. 2008-206263

(51) Int. Cl.
*H01J 1/62*    (2006.01)
*H01J 9/42*    (2006.01)
(52) U.S. Cl.
USPC ............ 313/504; 313/507; 445/4; 315/169.3
(58) Field of Classification Search
CPC ........ H01L 27/105; H01L 27/115; G02F 1/055
USPC .................... 315/169.1, 169.3; 313/504–511
See application file for complete search history.

(56) References Cited

U.S. PATENT DOCUMENTS

| | | | |
|---|---|---|---|
| 2005/0236620 A1 | 10/2005 | Yamada | |
| 2007/0151659 A1 | 7/2007 | Park | |

FOREIGN PATENT DOCUMENTS

| | | |
|---|---|---|
| JP | 09-167684 | 6/1997 |
| JP | 10-012377 | 1/1998 |
| JP | 2002-110350 | 4/2002 |
| JP | 2002-534782 | 10/2002 |
| JP | 2003-107238 | 4/2003 |
| JP | 2005-316469 | 11/2005 |

OTHER PUBLICATIONS

International Search Report corresponding to PCT/JP09/063461 dated Oct. 20, 2009.
Supplementary European Search Report dated Nov. 17, 2011 in connection with counterpart EP Application No. 09 804 896.0.

*Primary Examiner* — Tracie Y Green
(74) *Attorney, Agent, or Firm* — Dentons US LLP

(57) ABSTRACT

A display device capable of early finding a sign such as misregistration or width variation of an emission layer formed by a layer transfer method, and a manufacturing method of the same are provided. In an inspection region 150 outside of an effective region 110, inspection pixels Px2 made up of organic light-emitting elements 10R, 10G and 10B are provided, and a distance W2 between the inspection pixels Px2 on both sides of a color targeted for inspection is shorter than a distance W1 between display pixels Px1 on both sides of the color targeted for inspection. Based on a change in a chromaticity or a spectrum shape of EL or PL light emission of the inspection pixel Px2, a sign such as misregistration of a red-light emission layer 15CR, a green-light emission layer 15CG, is found at an early stage.

20 Claims, 28 Drawing Sheets

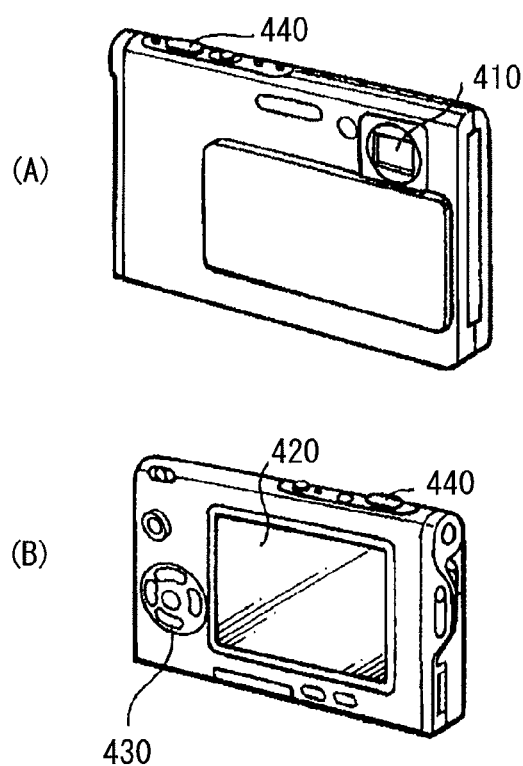
F I G. 35

DISPLAY DEVICE FOR DETECTING MISREGISTRATION AND WIDTH VARIATION AND METHOD OF MANUFACTURING SAME

TECHNICAL FIELD

The present invention relates to a display device in which organic light-emitting elements are formed by a laser transfer method and a method of manufacturing the same.

BACKGROUND ART

In recent years, next-generation display devices have been developed briskly, and attention has been focused on an organic light-emitting display device that uses an organic light-emitting element (organic EL (Electroluminescence) element) in which a first electrode, plural organic layers including a light emission layer, and a second electrode are sequentially laminated on a driving substrate. The organic light-emitting display device has such features that: a view angle is wide because it is of a self-light-emitting type; a backlight is not required and therefore power-saving can be expected; responsiveness is high; the thickness of the device can be reduced; and so on. Therefore, application to a large-screen display device such as a TV is strongly desired.

In order to increase the size and productivity of the organic light-emitting display device, use of a larger mother glass has been studied. At the time, in a method of forming a light-emission layer by using a general metal mask, light-emission layers of R, G and B are patterned by evaporating or applying a light-emitting material via a metal mask in which an opening pattern is provided on a metal sheet and therefore, it is necessary to increase the size of the metal mask according to a large substrate.

However, because of the upsizing of the metal mask, a deformation occurs due to the weight of the mask and thermal expansion at the time of evaporation is conspicuous and moreover, there arises such a problem that the accuracy of the opening pattern of the metal mask itself is reduced due to the upsizing and thus, patterning accuracy of the light-emission layer is also not achieved. Further, damage to the element due to contact between the metal mask and the substrate, and defect failure due to foreign matter on the mask become serious as the size increases. Therefore, a patterning technique requiring no metal mask is desired.

As maskless patterning methods for a large substrate, there are an ink-jet method (for example, see PLT 1) and a laser transfer method (for example, PLT 1 and PLT 3). The laser transfer method is a method of: forming a donor element in which a transfer layer including a light-emitting material is formed in a support member; disposing this donor element opposite a transferred substrate for forming an organic light-emitting element; and transferring the transfer layer to the transferred substrate by irradiating with a laser beam in a reduced pressure environment (see, for example, PLT 2 and PLT 3). With respect to a conventional mask deposition method, the laser transfer method has two advantages: definition can be made higher and a large substrate can be dealt with. In order to realize mass production of a large TV of organic EL, establishment of a manufacturing technique for the large substrate is considered to be necessary, and the laser transfer method can maintain the patterning accuracy constant with respect to the large substrate as well and thus is one of promising candidates for that.

In the laser transfer method, as illustrated in FIG. 39, within an effective region 810, display pixels Px1 made up of organic light-emitting elements 810R, 810G and 810B are formed in a matrix, and the display pixels Px1 of the same color are arranged in the same column. In the display pixels Px1 composed of the organic light-emitting elements 810R in the same column, a continuous red-light emission layer 815CR is formed by the laser transfer method. Similarly, in the display pixels Px1 composed of the organic light-emitting elements 810G in the same column, a continuous green-light emission layer 815CG is formed by the laser transfer method.

CITATION LIST

Patent Literature

PTL 1: Japanese Unexamined Patent Application Publication No. 1998-12377

PTL 2: Japanese Unexamined Patent Application Publication No. 2002-110350

PTL 3: Japanese Unexamined Patent Application Publication No. 2002-534782

PTL 4: Japanese Unexamined Patent Application Publication No. 2003-107238

SUMMARY OF INVENTION

Generally, in the laser transfer method, in order to increase the productivity, besides an increase in the scanning speed of the laser or the substrate, it is conceivable to reduce the processing time per substrate by using multi-laser heads or multi-beams. In such a case, there was a possibility that due to a variation in distance between the heads, nonuniformity in beam intensity or variations in space between the beams, or their changes over time, as illustrated in FIG. 39, misregistration or width variation of the transferred red-light emission layer 815CR or the green-light emission layer 815CG would occur. Such misregistration or width variation causes a failure such as color mixture, nonuniformity in film thickness distribution, and the like, but even immediately before occurrence of such a failure, an abnormality is not observed in light emission and thus, measures tended to be late. The light-emission layer of the organic light-emission layer generally has a film thickness of some 10 nm to some 100 nm and thus, was hard to recognize, and it was relatively hard to control the position or the width of the transferred light-emission layer. Further, it was not easy to identify the head or the beam causing the misregistration or the width variation.

Furthermore, there was a possibility that when a failure due to the misregistration of the laser head occurred, since there was a time lag between a transfer process and an inspection process, most of panels produced in the meantime would become defective, affecting yield significantly.

In PTL 4, the patterning positional accuracy evaluation pattern of the organic EL pattern is disclosed. However, in this conventional technique, the patterning method of the organic EL is limited to the ink-jet method, and a measurement subject is not a film but is a droplet and thus, the width of a pattern to be finally formed in a light emitting region was unclear. In addition, it was difficult to identify a head or a nozzle causing deterioration of the positional accuracy.

The present invention has been made in view of the foregoing problems, and aims to provide a display device that can early detect a sign such as misregistration or width variation of a light-emission layer formed by a laser transfer method and a method of manufacturing the same.

A first display device according to the present invention includes the following elements (A) and (B).

(A) An effective region in which on a substrate, display pixels composed of organic light-emitting elements are formed in a matrix, and the display pixels of the same color are arranged in the same column.

(B) An inspection region which has inspection pixels composed of organic light-emitting elements, outside of the effective region of the substrate, and in which a distance between the inspection pixels on both sides of a color targeted for inspection is shorter than a distance between the display pixels on both sides of the color targeted for inspection.

A second display device according to the present invention includes the following elements (A) and (B).

(A) An effective region in which on a substrate, display pixels composed of organic light-emitting elements are formed in a matrix, and the display pixels of the same color are arranged in the same column.

(B) An inspection region which has inspection patterns including reflecting layers, outside of the effective region of the substrate, and in which a distance between the inspection patterns on both sides of a color targeted for inspection is shorter than a distance between the display pixels on both sides of the color targeted for inspection.

A third display device according to the present invention includes the following elements (A) and (B).

(A) An effective region in which on a substrate, display pixels composed of organic light-emitting elements are formed in a matrix, and the display pixels of the same color are arranged in the same column.

(B) An inspection region which has an inspection pixel composed of an organic light-emitting element, outside of the effective region of the substrate, and in which the inspection pixel is provided in the same column as a column of the display pixel of a color targeted for inspection, and has a width wider than that of the display pixel.

A fourth display device according to the present invention includes the following elements (A) and (B).

(A) an effective region in which on a substrate, display pixels composed of organic light-emitting elements are formed in a matrix, and the display pixels of the same color are arranged in the same column.

(B) An inspection region which has an inspection pattern including a reflecting layer, outside of the effective region of the substrate, and in which the inspection pattern is provided in the same column as a column of the display pixel of a color targeted for inspection, and has a width wider than that of the display pixel.

A fifth display device according to the present invention includes the following elements (A) and (B).

(A) An effective region in which on a substrate, display pixels composed of organic light-emitting elements are formed in a matrix, and the display pixels of the same color are arranged in the same column.

(B) An inspection region which has an inspection pattern including a reflecting layer and a scale, outside of the effective region of the substrate, and in which the inspection pattern is formed straight in a row direction covering a column of a color targeted for inspection and at least a part of columns on both sides of the column.

A first method of manufacturing a display device according to the present invention includes the following steps (A) through (E).

(A) A step of forming first electrodes of display pixels in a matrix in an effective region of a substrate, forming first electrodes of inspection pixels in an inspection region outside of the effective region, and making a distance between the first electrodes of the inspection pixels on both sides of a color targeted for inspection to be shorter than a distance between the first electrodes of the display pixels on both sides of the color targeted for inspection.

(B) A step of forming, on the first electrodes of the display pixels and the first electrodes of the inspection pixels, an organic layer including at least one of a red-light emission layer, a green-light emission layer and a blue-light emission layer, and forming at least the red-light emission layer and the green-light emission layer by a laser transfer method, straight in a column direction to extend beyond the effective region and reach the inspection region.

(C) A step of forming a second electrode on the organic layer.

(D) A step of causing the inspection pixels to emit light by EL or PL (Photoluminescence), and measuring a chromaticity or a spectrum shape.

(E) A step of determining, based on the chromaticity or the spectrum shape, whether a position or a width of the red-light emission layer, the green-light emission layer or the blue-light emission layer is out of a specification range.

A second method of manufacturing a display device according to the present invention includes the following steps (A) through (E).

(A) A step of forming first electrodes of display pixels in a matrix in an effective region of a substrate, forming inspection patterns including reflecting layers in an inspection region outside of the effective region, and making a distance between the inspection patterns on both sides of a color targeted for inspection to be shorter than a distance between the first electrodes of the display pixels on both sides of the color targeted for inspection.

(B) A step of forming, on the first electrodes, an organic layer including at least one of a red-light emission layer, a green-light emission layer and a blue-light emission layer, and forming at least the red-light emission layer and the green-light emission layer by a laser transfer method, straight in a column direction to extend beyond the effective region and reach the inspection region.

(C) A step of forming a second electrode on the organic layer.

(D) A step of irradiating the inspection patterns with light, and measuring a chromaticity or a spectrum shape of reflected light or PL light emission.

(E) A step of determining, based on the chromaticity or the spectrum shape, whether a position or a width of the red-light emission layer, the green-light emission layer or the blue-light emission layer is out of a specification range.

A third method of manufacturing a display device according to the present invention includes the following steps (A) through (E).

(A) A step of forming first electrodes of display pixels in a matrix in an effective region of a substrate, and forming, in an inspection region outside of the effective region, a first electrode of an inspection pixel in the same column as a column of the display pixel of a color targeted for inspection to have a width wider than the first electrode of the display pixel.

(B) A step of forming, on the first electrodes of the display pixels and the first electrode of the inspection pixel, an organic layer including at least one of a red-light emission layer, a green-light emission layer and a blue-light emission layer, and forming at least the red-light emission layer and the green-light emission layer by a laser transfer method, straight in a column direction to extend beyond the effective region and reach the inspection region.

(C) A step of forming a second electrode on the organic layer.

(D) A step of causing the inspection pixel to emit light by EL or PL, and measuring a chromaticity or a spectrum shape.

(E) A step of determining, based on the chromaticity or the spectrum shape, whether a width of the red-light emission layer, the green-light emission layer or the blue-light emission layer is out of a specification range.

A fourth method of manufacturing a display device according to the present invention includes the following steps (A) through (E).

(A) A step of forming first electrodes of display pixels in a matrix in an effective region of a substrate, and forming, in an inspection region outside of the effective region, an inspection pattern including a reflecting layer in the same column as a column of the display pixel of a color targeted for inspection to have a width wider than the first electrode of the display pixel.

(B) A step of forming, on the first electrodes, an organic layer including at least one of a red-light emission layer, a green-light emission layer and a blue-light emission layer, and forming at least the red-light emission layer and the green-light emission layer by a laser transfer method, straight in a column direction to extend beyond the effective region and reach the inspection region.

(C) A step of forming a second electrode on the organic layer.

(D) A step of irradiating the inspection pattern with light, and measuring a chromaticity or a spectrum shape of reflected light or PL light emission.

(E) A step of determining, based on the chromaticity or the spectrum shape, whether a width of the red-light emission layer, the green-light emission layer or the blue-light emission layer is out of a specification range.

A fifth method of manufacturing a display device according to the present invention includes the following steps (A) through (E).

(A) A step of forming first electrodes of display pixels in a matrix in an effective region of a substrate, and forming, in an inspection region outside of the effective region, an inspection pattern composed of a reflecting layer and having a scale, straight in a row direction covering a column of a color targeted for inspection and at least a part of columns on both sides of the column.

(B) A step of forming, on the first electrodes, an organic layer including at least one of a red-light emission layer, a green-light emission layer and a blue-light emission layer, and forming at least the red-light emission layer and the green-light emission layer by a laser transfer method, straight in a column direction to extend beyond the effective region and reach the inspection region.

(C) A step of forming a second electrode on the organic layer.

(D) A step of irradiating the inspection pattern with light, and measuring a chromaticity or a spectrum shape of reflected light or PL light emission.

(E) A step of determining, based on the chromaticity or the spectrum shape, whether a position or a width of the red-light emission layer, the green-light emission layer or the blue-light emission layer is out of a specification range.

In the first display device of the present invention, in the inspection region outside of the effective region, the inspection pixels composed of the organic light-emitting elements are provided, and the distance between the inspection pixels on both sides of the color targeted for inspection is shorter than the distance between the display pixels on both sides of the color targeted for inspection and thus, in a case in which misregistration or width variation of the red-light emission layer, the green-light emission layer or the blue-light emission layer formed by the laser transfer method occurs, the chromaticity or the spectrum shape of the EL or PL light emission of the inspection pixel changes. Therefore, before a failure such as color mixture or nonuniformity of film-thickness distribution takes place, a sign such as the misregistration or the width variation of the red-light emission layer, the green-light emission layer or the blue-light emission layer can be found at an early stage.

In the second display device of the present invention, in the inspection region outside of the effective region, the inspection patterns including the reflecting layers are provided, and the distance between the inspection patterns on both sides of the color targeted for inspection is shorter than the distance between the display pixels on both sides of the color targeted for inspection and thus, in a case in which misregistration or width variation of the red-light emission layer, the green-light emission layer or the blue-light emission layer formed by the laser transfer method occurs, the red-light emission layer, the green-light emission layer or the blue-light emission layer are formed to be overlaid on the inspection pattern. Therefore, when the inspection pattern is irradiated with the light, in a part overlaid with the red-light emission layer, the green-light emission layer or the blue-light emission layer, the chromaticity or the spectrum shape of the reflected light or the PL light emission changes due to an interference effect. Accordingly, before a failure such as color mixture or nonuniformity of film-thickness distribution takes place, a sign such as the misregistration or the width variation of the red-light emission layer, the green-light emission layer or the blue-light emission layer can be found at an early stage.

In the third display device of the present invention, in the inspection region outside of the effective region, the inspection pixel composed of the organic light-emitting element is provided in the same column as the column of the display pixel of the color targeted for inspection, and the width of the inspection pixel is wider than that of the display pixel and thus, in a case in which the width of the red-light emission layer, the green-light emission layer or the blue-light emission layer formed by the laser transfer method is short, the chromaticity or the spectrum shape of the EL or PL light emission of the inspection pixel changes. Therefore, before a failure such as color mixture or nonuniformity of film-thickness distribution takes place, a sign such as a width shortage of the red-light emission layer, the green-light emission layer or the blue-light emission layer can be found at an early stage.

In the fourth display device of the present invention, in the inspection region outside of the effective region, the inspection pattern including the reflecting layer is provided in the same column as the column of the display pixel of the color targeted for inspection, and the width of the inspection pattern is wider than that of the display pixel and thus, in a case in which the width of the red-light emission layer, the green-light emission layer or the blue-light emission layer formed by the laser transfer method is short, the chromaticity or the spectrum shape of the reflected light or the PL light emission of the inspection pattern changes. Therefore, before a failure such as color mixture or nonuniformity of film-thickness distribution takes place, a sign such as a width shortage of the red-light emission layer, the green-light emission layer or the blue-light emission layer can be found at an early stage.

In the fifth display device of the present invention, in the inspection region outside of the effective region, the inspection pattern including the reflecting layer and the scale is provided, and the inspection pattern is formed straight in the row direction covering the column of the color targeted for inspection and at least a part of the columns on both sides of the column and thus, when the inspection pattern is irradiated with the light, in a part overlapping the red-light emission layer, the green-light emission layer or the blue-light emission layer, the chromaticity or the spectrum shape of the reflected light or the PL light emission changes due to an interference effect. By reading a mark on the scale indicating the position corresponding to a change in the chromaticity or the spectrum shape, the position or the width of the red-light emission layer, the green-light emission layer or the blue-light emission layer is made clear. Accordingly, before a failure such as color mixture or nonuniformity of film-thickness distribution takes place, a sign such as the misregistration or the width variation of the red-light emission layer, the green-light emission layer or the blue-light emission layer can be found at an early stage.

According to the first display device of the present invention, in the inspection region outside of the effective region, the inspection pixels composed of the organic light-emitting elements are provided, and the distance between the inspection pixels on both sides of the color targeted for inspection is shorter than the distance between the display pixels on both sides of the color targeted for inspection and thus, based on a change in the chromaticity or the spectrum shape of the EL or PL light emission of this inspection pixel, the sign such as the misregistration or the width variation of the red-light emission layer, the green-light emission layer or the blue-light emission layer can be found at an early stage.

According to the second display device of the present invention, in the inspection region outside of the effective region, the inspection patterns including the reflecting layers are provided, and the distance between the inspection patterns on both sides of the color targeted for inspection is shorter than the distance between the display pixels on both sides of the color targeted for inspection and thus, based on a changed in the chromaticity or the spectrum shape of the reflected light or the PL light emission of the inspection pattern, the sign such as the misregistration or the width variation of the red-light emission layer, the green-light emission layer or the blue-light emission layer can be found at an early stage.

According to the third display device of the present invention, in the inspection region outside of the effective region, the inspection pixel composed of the organic light-emitting element is provided in the same column as the column of the display pixel of the color targeted for inspection, and the width of the inspection pixel is wider than that of the display pixel and thus, based on a changed in the chromaticity or the spectrum shape of the EL or PL light emission of this inspection pixel, the sign such as the width shortage of the red-light emission layer, the green-light emission layer or the blue-light emission layer can be found at an early stage.

According to the fourth display device of the present invention, in the inspection region outside of the effective region, the inspection pattern including the reflecting layer is provided in the same column as the column of the display pixel of the color targeted for inspection, and the width of this inspection pattern is wider than that of the display pixel and thus, based on a changed in the chromaticity or the spectrum shape of the reflected light or the PL light emission of the inspection pattern, the sign such as the width shortage of the red-light emission layer, the green-light emission layer or the blue-light emission layer can be found at an early stage.

According to the fifth display device of the present invention, in the inspection region outside of the effective region, the inspection pattern including the reflecting layer and the scale is provided, and the inspection pattern is formed straight in the row direction covering the column of the color targeted for inspection and at least a part of the columns on both sides of the column and thus, by reading a mark on the scale indicating the position corresponding to a change in the chromaticity or the spectrum shape of the reflected light or the PL light emission of the inspection pattern, the sign such as the misregistration or the width variation of the red-light emission layer, the green-light emission layer or the blue-light emission layer can be found at an early stage.

According to the first method of manufacturing the display device of the present invention, in the inspection region outside of the effective region, the inspection pixels composed of the organic light-emitting elements are provided, and the distance between the inspection pixels on both sides of the color targeted for inspection is shorter than the distance between the display pixels on both sides of the color targeted for inspection, the inspection pixel is caused to emit the light by the EL or the PL, and based on the chromaticity or the spectrum shape, it is determined whether the position or the width of the red-light emission layer, the green-light emission layer or the blue-light emission layer is out of the specification range and thus, the sign such as the misregistration or the width variation of the red-light emission layer, the green-light emission layer or the blue-light emission layer can be found at an early stage.

According to the second method of manufacturing the display device of the present invention, in the inspection region outside of the effective region, the inspection patterns including the reflecting layers are provided, the distance between the inspection patterns on both sides of the color targeted for inspection is shorter than the distance between the first electrodes of the display pixels on both sides of the color targeted for inspection, the inspection pixel is irradiated with the light, and based on the chromaticity or the spectrum shape of the reflected light or the PL light emission, it is determined whether the position or the width of the red-light emission layer, the green-light emission layer or the blue-light emission layer is out of the specification range and thus, the sign such as the misregistration or the width variation of the red-light emission layer, the green-light emission layer or the blue-light emission layer can be found at an early stage.

According to the third method of manufacturing the display device of the present invention, in the inspection region outside of the effective region, the first electrode of the inspection pixel is provided in the same column as the column of the display pixel of the color targeted for inspection, the width of the first electrode of the inspection pixel is wider than the first electrode of the display pixel, the inspection pixel is caused to emit the light by the EL or the PL, and based on the chromaticity or the spectrum shape, it is determined whether the width of the red-light emission layer, the green-light emission layer or the blue-light emission layer is out of the specification range and thus, the sign such as the width shortage of the red-light emission layer, the green-light emission layer or the blue-light emission layer can be found at an early stage.

According to the fourth method of manufacturing the display device of the present invention, in the inspection region outside of the effective region, the inspection pattern including the reflecting layer is provided in the same column as the column of the display pixel of the color targeted for inspection, the width of the inspection pattern is wider than the first electrode of the display pixel, the inspection pattern is irradiated with the light, and based on the chromaticity or the spectrum shape of the reflected light or the PL light emission, it is determined whether the width of the red-light emission layer, the green-light emission layer or the blue-light emission layer is out of the specification range and thus, the sign such as the width shortage of the red-light emission layer, the green-light emission layer or the blue-light emission layer can be found at an early stage.

According to the fifth method of manufacturing the display device of the present invention, in the inspection region outside of the effective region, the inspection pattern including the reflecting layer and the scale is provided at a predetermined position, the inspection pattern is irradiated with the light, and based on the chromaticity or the spectrum shape of the reflected light or the PL light emission, it is determined whether the position or the width of the red-light emission layer, the green-light emission layer or the blue-light emission layer is out of the specification range and thus, by reading a mark on the scale indicating the position corresponding to a change in the chromaticity or the spectrum shape of the reflected light or the PL light emission of the inspection pattern, the sign such as the misregistration or the width variation of the red-light emission layer, the green-light emission layer or the blue-light emission layer can be found at an early stage.

BRIEF DESCRIPTION OF DRAWINGS

FIG. 35 is a diagram in which (A) is a perspective view illustrating an external appearance of an application example 2 viewed from a front side, and (B) is a perspective view illustrating an external appearance viewed from a rear side.

DESCRIPTION OF EMBODIMENTS

Embodiments of the present invention will be described below in detail with reference to the drawings. Incidentally, the description will be provided in the following order.

1. First embodiment (detection of misregistration and width variation: example of increasing width of inspection pixel and using inspection pattern with scale)
2. Modification 1 (example in which inspection pattern with scale is not used)
3. Modification 2 (example in which position of inspection pixel is shifted)
4. Modification 3 (example in which arrangement of inspection pixels is changed)
5. Modification 4 (example in which the long-side size and the number of inspection pixels are changed)
6. Modification 5 (another example of identification pattern)

7. Modification 6 (example of three-color laser transfer)
8. Modification 7 (example in which two or more colors are inspected with one inspection pixel)
9. Modification 8 (example in which arrangement of inspection region is changed)
10. Second embodiment (detection of misregistration and width variation: example of using inspection pattern)
11. Third embodiment (detection of width shortage: example of using inspection pixel)
12. Fourth embodiment (detection of width shortage: example of using inspection pattern)
13. Fifth embodiment (detection of misregistration and width variation: example of using inspection pattern with scale alone)

<1. First Embodiment>

Display Device

Figure 1:
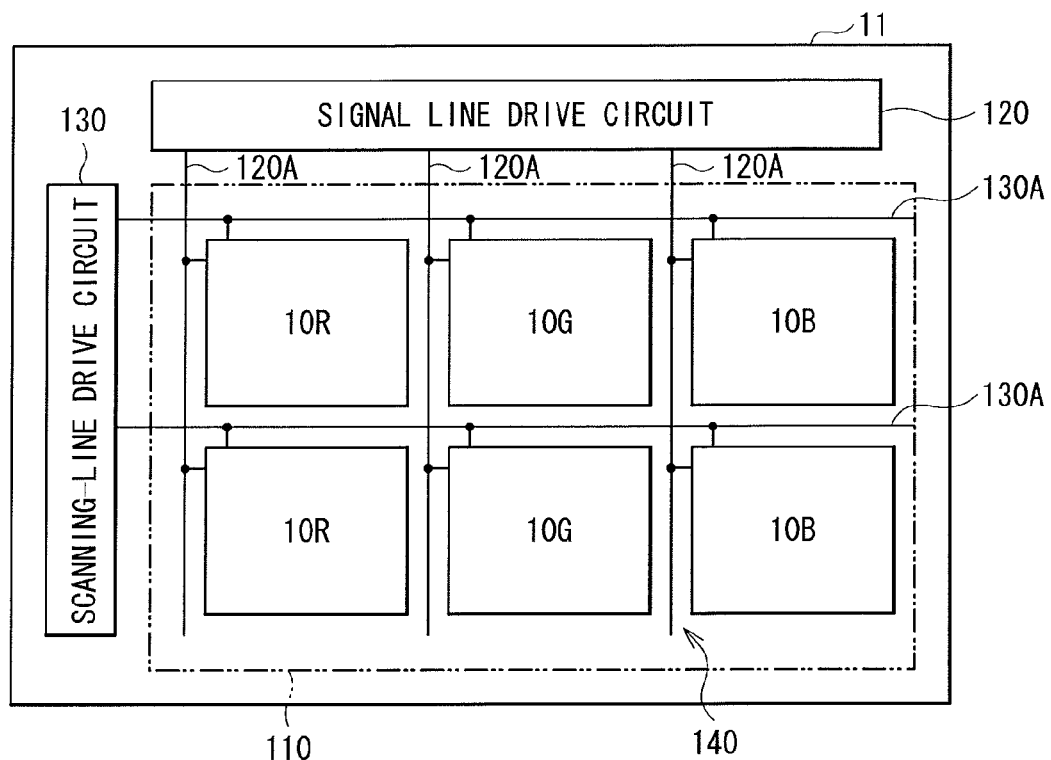
FIG. 1 is a diagram illustrating a configuration of a display device according to a first embodiment of the present invention.

FIG. 1 illustrates a configuration of a display device according to the first embodiment of the present invention. This display device is used as an extra-thin type of organic light-emission color display device or the like, and is, for example, a device in which, on a drive substrate 11 made of glass, an effective region 110 where display pixels Px1 made up of plural organic light-emitting elements 10R, 10G and 10B to be described later are arranged in rows and columns (in a matrix) is formed, and a signal-line drive circuit 120 serving as a driver for image display and a scanning-line drive circuit 130 are formed around this effective region 110.

Figure 2:
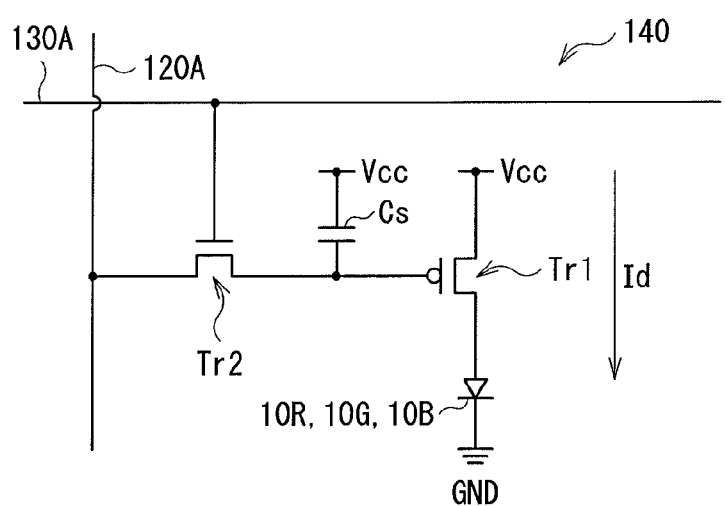
FIG. 2 is a diagram illustrating an example of a pixel drive circuit illustrated in FIG. 1.

A pixel drive circuit 140 is formed within the effective region 110. FIG. 2 illustrates an example of the pixel drive circuit 140. This pixel drive circuit 140 is formed in a lower layer of a first electrode 13 to be described later, and is an active type of drive circuit having: a drive transistor Tr1 and a write transistor Tr2; a capacitor (retention capacity) Cs therebetween; and the organic light-emitting element 10R (or 10G, 10B) connected to the drive transistor Tr1 in series between a first power supply line (Vcc) and a second power supply line (GND). The drive transistor Tr1 and the write transistor Tr2 are each made up of a general thin-film transistor (TFT (Thin Film Transistor)) and the structure may be, for example, a reversed staggered structure (the so-called bottom gate type) or a staggered structure (the so-called top gate type) and is not limited in particular.

In the pixel drive circuit 140, plural signal lines 120A are arranged in a column direction and plural scanning lines 130A are arranged in a row direction. An intersection of each signal line 120A and each scanning line 130A corresponds to any one (sub-pixel) of the organic light-emitting elements 10R, 10G and 10B. Each signal line 120A is connected to the signal-line drive circuit 120, and image signals are supplied to the source electrode of the write transistor Tr2 through the signal lines 120A from this signal-line drive circuit 120. Each scanning line 130A is connected to the scanning-line drive circuit 130, and scanning signals are sequentially supplied to the gate electrode of the write transistor Tr2 through the scanning lines 130A from this scanning-line drive circuit 130.

Figure 3:
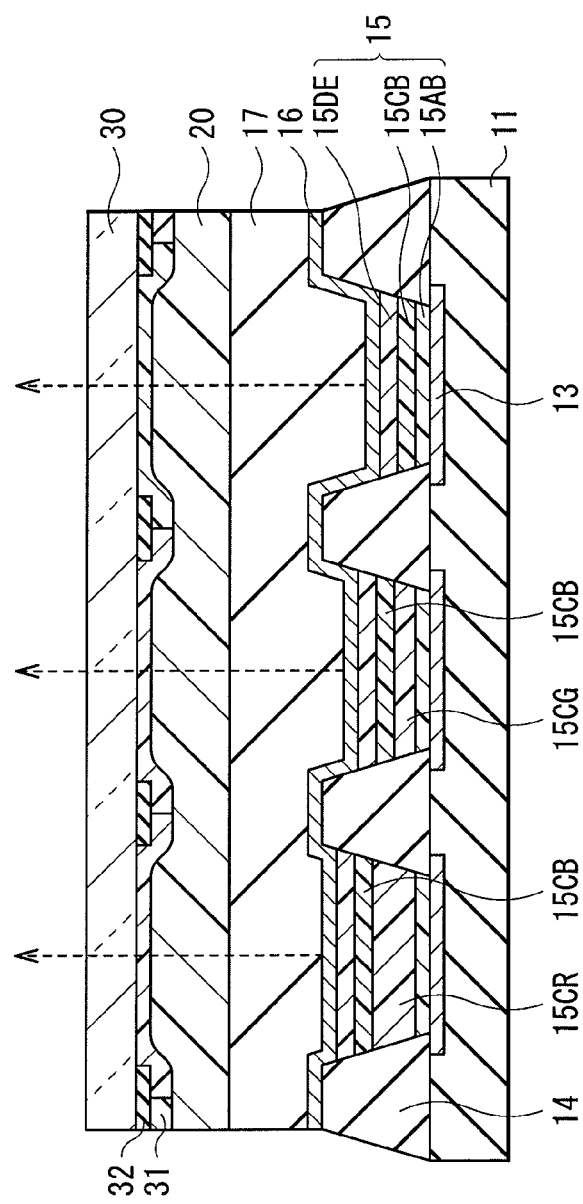
FIG. 3 is a cross-sectional view illustrating a configuration of an effective region illustrated in FIG. 1.

FIG. 3 illustrates a cross-sectional configuration of the effective region 110. In the effective region 110, display pixels (sub-pixels) Px1 each made up of any one of the organic light-emitting element 10R emitting red light, the organic light-emitting element 10G emitting green light, and the organic light-emitting element 10B emitting blue light are formed in rows and columns (a matrix). Incidentally, the combination of the adjacent organic light-emitting elements 10R, 10G and 10B forms one picture element (pixel), but here, any one of the organic light-emitting elements 10R, 10G and 10B is referred to as the display pixel Px1. For example, the pitch of the picture element composed of the combination of the adjacent organic light-emitting elements 10R, 10G and 10B is, for example, 300 µm.

Each of the organic light-emitting elements 10R, 10G and 10B has such a structure that from the drive substrate 11 side, the first electrode 13 serving as an anode, an insulating layer 14, an organic layer 15 including a red-light emission layer 15CR, a green-light emission layer 15CG and a blue-light emission layer 15CB to be described later, and a second electrode 16 serving as a cathode are laminated in this order so that the drive substrate 11 and the first electrode 13 sandwich a drive transistor (not illustrated) of the above-mentioned pixel drive circuit 140 and a planarizing dielectric film (not illustrated).

Such organic light-emitting elements 10R, 10G and 10B are covered with a protective film 17 such as silicon nitride (SiNx), and sealed by affixing a sealing substrate 30 made of glass or the like to the entire surface of this protective film 17 with an adhesive layer 20 in between.

The first electrode 13 is made of, for example, ITO (Indium Tin Oxide) or IZO (Indium Zinc Oxide). Further, the first electrode 13 may be formed of a reflecting electrode. In that case, the first electrode 13 has a thickness of, for example, 100 nm or more and 1,000 nm or less, and is desired to have as high a reflectance as possible so as to increase luminous efficiency. For example, as a material forming the first electrode 13, there is a simple substance or an alloy of a metallic element such as chromium (Cr), gold (Au), platinum (Pt), nickel (Ni), copper (Cu), tungsten (W) or silver (Ag).

The insulating layer 14 is intended to ensure an insulation property between the first electrode 13 and the second electrode 16 and make the light emitting region to be in a desired shape precisely, and is made of, for example, photosensitive resin such as silicon oxide or polyimide. The insulating layer 14 is provided with an opening section corresponding to a light emitting region of the first electrode 13, and also has a function as a partition on the drive substrate 11 side, corresponding to a partition 42 of a donor substrate 50 to be described later. Incidentally, the organic layer 15 and the second electrode 16 may be continuously provided not only on the light emitting region 13A but also on the insulating layer 14, but light emission occurs only in the opening section of the insulating layer 14.

The organic layer 15 of the organic light-emitting element 10R has such a structure that from the first electrode 13 side sequentially, a hole injection layer and hole transport layer 15AB, the red-light emission layer 15CR, the blue-light emission layer 15CB, and an electron transport layer and electron injection layer 15DE are laminated. The organic layer 15 of the organic light-emitting element 10G has such a structure that from the first electrode 13 side sequentially, the hole injection layer and hole transport layer 15AB, the green-light emission layer 15CG, the blue-light emission layer 15CB, and the electron transport layer and electron injection layer 15DE are laminated. The organic layer 15 of the organic light-emitting element 10B has such a structure that from the first electrode 13 side sequentially, the hole injection layer and hole transport layer 15AB, the blue-light emission layer 15CB, and the electron transport layer and electron injection layer 15DE are laminated. Of these, the layers except the red-light emission layer 15CR, the green-light emission layer 15CG and the blue-light emission layer 15CB may be provided as needed. The hole injection layer is intended to increase hole injection efficiency, and also is a buffer layer to prevent leakage. The hole transport layer is intended to increase hole transport efficiency to the red-light emission layer 15CR, the green-light emission layer 15CG and the blue-light emission layer 15CB. The red-light emission layer 15CR, the green-light emission layer 15CG and the blue-light emission layer 15CB emit the light when recombination of the electron and the hole takes place with the application of an electric field. The electron transport layer is intended to increase electron transport efficiency to the red-light emission layer 15CR, the green-light emission layer 15CG and the blue-light emission layer 15CB. The electron injection layer has a thickness of, for example, about 0.3 nm, and made from LiF, $Li_2O$ and the like. Incidentally, in FIG. 3, the hole injection layer and the hole transport layer are illustrated as a single layer (hole injection layer and hole transport layer 15AB), and the electron transport layer and the electron injection layer are illustrated as a single layer (electron transport layer and electron injection layer 15DE).

The red-light emission layer 15CR and the green-light emission layer 15CG are formed by a laser transfer method to be described later. The blue-light emission layer 15CB is formed as a blue-light layer common to all the organic light-emitting elements 10R, 10G and 10B.

The hole injection layer of the organic light-emitting element 10R has a thickness of, for example, 5 nm or more and 300 nm or less, and made of 4,4′,4″-tris(3-methylphenylphenylamino)triphenylamine (m-MTDATA) or 4,4′,4″-tris(2-naphthylphenylamino) triphenylamine (2-TNATA). The hole transport layer of the organic light-emitting element 10R has a thickness of, for example, 5 nm or more and 300 nm or less, and made of bis[(N-naphthyl)-N-phenyl]benzidine (α-NPD). The red-light emission layer 15CR of the organic light-emitting element 10R has a thickness of, for example, 10 nm or more and 100 nm or less, and made of 9,10-di-(2-naphthyl) anthracene (ADN) mixed with 30 wt % of 2,6=bis[4′=methoxydiphenylamino]styryl]=1,5=dicyano naphthalene (BSN). The blue-light emission layer 15CB of the organic light-emitting element 10R has a thickness of, for example, 10 nm or more and 100 nm or less, and made of ADN mixed with 2.5 wt % of 4,4′=bis[2={4=(N,N=diphenylamino]phenyl}vinyl] biphenyl (DPAVBi). The electron transport layer of the organic light-emitting element 10R has a thickness of, for example, 5 nm or more and 300 nm or less, and made of 8=hydroxyquinolinealuminum ($Alq_3$).

The hole injection layer of the organic light-emitting element 10G has a thickness of, for example, 5 nm or more and 300 nm or less, and made of m-MTDATA or 2-TNATA. The hole transport layer of the organic light-emitting element 10G has a thickness of, for example, 5 nm or more and 300 nm or less, and made of α-NPD. The green-light emission layer 15CG of the organic light-emitting element 10G has a thickness of, for example, 10 nm or more and 100 nm or less, and made of ADN mixed with 5 vol % of coumarin 6. The blue-light emission layer 15CB of the organic light-emitting element 10G has a thickness of, for example, 10 nm or more and 100 nm or less, and made of ADN mixed with 2.5 wt % of DPAVBi. The electron transport layer of the organic light-emitting element 10G has a thickness of, for example, 5 nm or more and 300 nm or less, and made of $Alq_3$.

The hole injection layer of the organic light-emitting element 10B has a thickness of, for example, 5 nm or more and 300 nm or less, and made of m-MTDATA or 2-TNATA. The hole transport layer of the organic light-emitting element 10B has a thickness of, for example, 5 nm or more and 300 nm or less, and made of α-NPD. The blue-light emission layer 15CB of the organic light-emitting element 10B has a thickness of, for example, 10 nm or more and 100 nm or less, and made of ADN mixed with 2.5 wt % of DPAVBi. The electron transport layer of the organic light-emitting element 10B has a thickness of, for example, 5 nm or more and 300 nm or less, and made of $Alq_3$.

The second electrode 16 has a thickness of, for example, 5 nm or more and 50 nm or less, and made of a simple substance or an alloy of a metallic element such as aluminum (Al), magnesium (Mg), calcium (Ca), and sodium (Na). Above all, an alloy (MgAg alloy) of magnesium and silver, or an alloy (AlLi alloy) of aluminum (Al) and lithium (Li) is preferable.

The protective film 17 is intended to prevent the entry of water into the organic layer 15, is made of a material of low water permeability and water absorptivity, and has a sufficient thickness. In addition, the protective film 17 has high permeability to light produced in the light emission layer 15C, and is made of, for example, a material having a permeability of 80% or more. For example, such a protective film 17 has a thickness of about 2 μm to 3 μm, and is made of an inorganic amorphous insulating material. Specifically, amorphous silicon (α-Si), amorphous silicon carbide (α-SiC), amorphous silicon nitride ($α-Si_{1-x}N_x$) and amorphous carbon (α-C) are preferable. Since these inorganic amorphous insulating materials do not form grains, the water permeability is low, and forms the excellent protective film 17. In addition, the protective film 17 may be made of a transparent conductive material such as ITO.

The adhesive layer 20 is made of, for example, a thermosetting type of resin or a UV curable type of resin.

The sealing substrate 30 is located on the side where the second electrode 16 of the organic light-emitting elements 10R, 10G and 10B is provided, seals the organic light-emitting elements 10R, 10G and 10B together with the adhesive layer 20, and is made of a material such as glass transparent for the light produced in the organic light-emitting elements 10R, 10G and 10B. The sealing substrate 30 is provided with, for example, a color filter 31 and a shielding layer 32 serving as a black matrix, takes out the light produced in the organic light-emitting elements 10R, 10G and 10B, absorbs external light reflected in the organic light-emitting elements 10R, 10G and 10B and wiring therebetween, and therefore improves contrast.

The color filter 31 may be provided on a surface on either side of the sealing substrate 30, but it is desirable that the color filter 31 be provided on the side where the organic light-emitting elements 10R, 10G and 10B are provided. This is because the color filter 31 is not exposed on the surface, and can be protected by the adhesive layer 20. In addition, this is because it is possible to avoid occurrence of a mixture of light resulting from the light emitted from the red-light emission layer 15CR, the green-light emission layer 15CG or the blue-light emission layer 15CB being incident upon the adjacent color filter 31 of other color, when the distance between the red-light emission layer 15CR, the green-light emission layer 15CG and the blue-light emission layer 15CB, and the color filter 31 is short.

The color filter 31 has a red filter, a green filter and a blue filter (none of them being illustrated), which are disposed sequentially corresponding to the organic light-emitting elements 10R, 10G and 10B, respectively.

The red filter, the green filter and the blue filter are, for example, rectangular and formed with no gap. These red filter, green filter and blue filter are made of resin mixed with pigments, and are adjusted so that by selection of a pigment, the light transmittance in a targeted wavelength range of red, green or blue is high, while the light transmittance in other wavelength ranges is low.

In the effective region 110, the shielding layer 32 is provided along the borders of the red filter, the green filter and the blue filter. The shielding layer 32 is made of, for example, a black resin film mixed with a black coloring agent and having an optical density of 1 or more, or a thin film filter using thin-film interference. Of these, it is preferable to use the black resin film so that the formation can be carried out easily at low cost. The thin film filter has one or more laminated thin film made of metal, metal nitride or metal oxide, and attenuates the light by using the thin-film interference. As the thin film filter, specifically, there is a filter in which chromium and chromium oxide (III) ($Cr_2O_3$) are laminated alternately.

Figure 4:
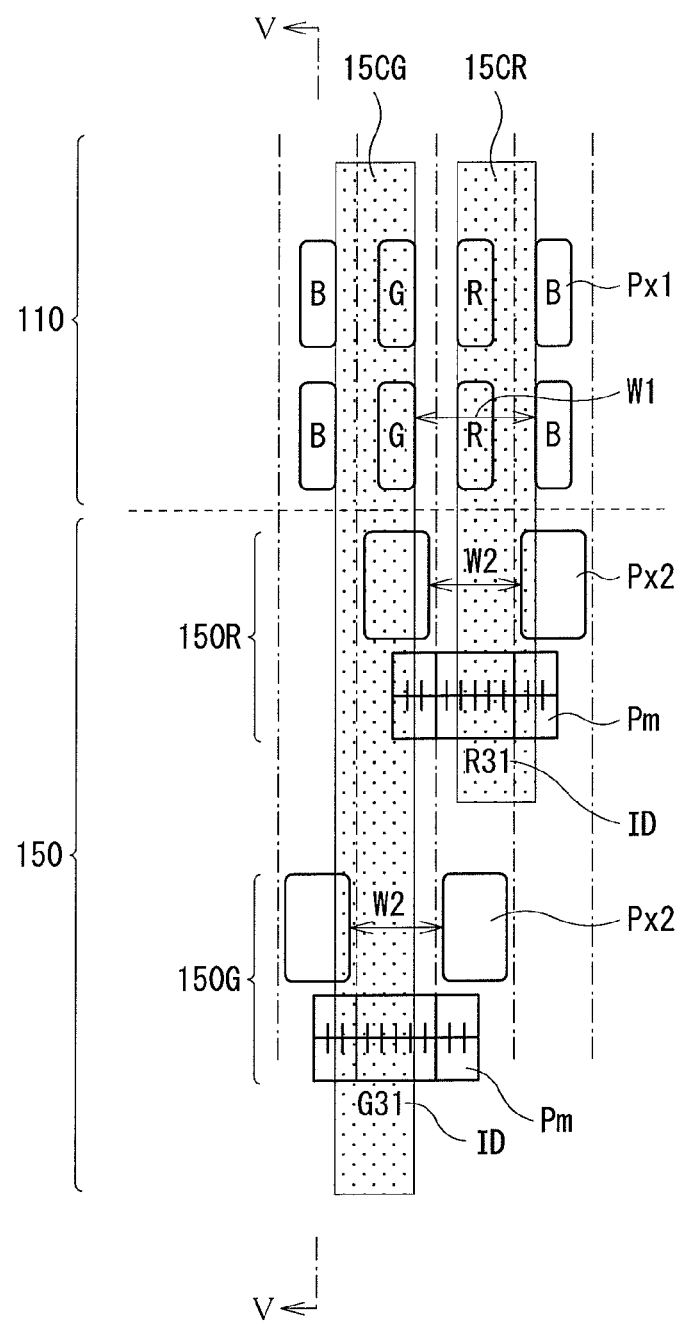
FIG. 4 is a plan view illustrating configurations of the effective region illustrated in FIG. 1 and an inspection region on the outside thereof.

FIG. 4 illustrates an example of the plane configuration of the effective region 110.

The display pixels Px1 made up of the organic light-emitting elements 10R, 10G and 10B each have approximately a rectangular flat shape and are formed in rows and columns (in a matrix), and the display pixels Px1 of the same color are arranged in the same column. Incidentally, in FIG. 4, the organic light-emitting elements 10R, 10G and 10B are given characters of R, G, and B, respectively, to be distinguished from one another.

Outside of the effective region 110, there is provided an inspection region 150 having inspection pixels Px2, inspection patterns Pm with scale, and identification patterns ID. The red-light emission layer 15CR and the green-light emission layer 15CG are formed straight in the column direction to extend beyond the effective region 110 and reach the inspection region 150 to be described later.

The inspection pixel Px2 is a color-mixture checking pixel to early find a sign of misregistration of the red-light emission layer 15CR and the green-light emission layer 15CG formed by the laser transfer method. There is provided a red (R) evaluation region 150R having the inspection pixels Px2 composed of the organic light-emitting elements 10G and 10B on both sides of the red-light emission layer 15CR. There is provided a green (G) evaluation region 150G having the inspection pixels Px2 composed of the organic light-emitting elements 10B and 10R on both sides of the green-light emission layer 15CG.

A distance W2 between the inspection pixels Px2 on both sides of the color targeted for the inspection is shorter than a distance W1 between the display pixels Px1 on both sides of the color targeted for the inspection. Specifically, the inspection pixel Px2 is provided on the same column as the column in which the display pixel Px1 on each of both sides of the color targeted for the inspection is provided, and is longer in width (a part exposed from the insulating layer 14 of the first electrode 13, namely, the width of the light emitting region 13A) than the width of the display pixel Px1.

Thus, in this display device, it is possible to find a sign such as misregistration or width variation of the red-light emission layer 15CR, the green-light emission layer 15CG, at an early stage.

Specifically, the distance W2 between the inspection pixels Px2 on both sides of the color targeted for the inspection is set to be a process control upper limit of lateral-ends position of the red-light emission layer 15CR, the green-light emission layer 15CG, which is determined by the transfer position and the size.

It is desirable that the inspection pixels Px2 be staggered for each color targeted for the inspection. This is because in a case in which wiring to the effective region 110 and wiring to the inspection pixel Px2 are formed in the layer, wiring space can be secured. In addition, generally, when multiple colors are mixed, a color of a long wavelength emits the light predominantly. Therefore, when, for example, the red-light emission layer 15CR and the green-light emission layer 15CG overlap the same inspection pixel Px2, the red-light emission becomes dominant, and the presence or absence of color mixture in the green color may become unclear. Therefore, to remove an influence of other color, it is desirable that the inspection pixels Px2 be staggered by shifting the position for each color targeted for the inspection.

Furthermore, desirably, the shorter the wavelength of the color targeted for the inspection is, the farther position away from the effective region 110 the inspection pixel Px2 is formed. In other words, it is desirable that the inspection pixels Px2 on both sides of the green-light emission layer 15CG be formed at positions further away from the effective region 110 than the inspection pixels Px2 on both sides of the red-light emission layer 15CR. In addition, in this case, it is desirable that the red-light emission layer 15CR of the long wavelength be not formed on the inspection pixels Px2 on both sides of the green-light emission layer 15CG. As described above, when the green-light emission layer 15CG and the red-light emission layer 15CR overlap the same inspection pixel Px2 and therefore color mixture occurs, the red-light emission of the long wavelength becomes dominant, and it is difficult to evaluate the color mixture in the green-light emission layer 15CG.

The inspection pattern Pm with scale is configured to include a reflecting layer and is formed straight in the row direction to cover the column of the color targeted for the inspection and at least a part of the columns on its both sides. By providing the inspection pattern Pm with scale, it is possible to find a sign of misregistration of the red-light emission layer 15CR, the green-light emission layer 15CG at an early stage, and also the amount of misregistration can be readily measured.

When, for example, the first electrode 13 is formed of the reflecting electrode, such an inspection pattern Pm with scale can be made of the same material as that of the first electrode 13. Further, the reflecting layer may be provided independently of the first electrode 13.

The identification pattern ID is intended to enable early measures by identifying a laser head or a laser beam causing the misregistration, and is provided on the extension of the column of the display pixels Px1 of the color targeted for the inspection. Specifically, as the identification patterns ID to identify the laser head or the laser beam used in the formation of the red-light emission layer 15CR and the green-light emission layer 15CG, for example, "R31" and "G31", respectively, are formed on the drive substrate 11 beforehand, and in a laser transfer process, the process is controlled to use the laser head or the laser beam corresponding to the identification pattern ID. In this example, the first alphabet (R or G) indicates the color, the next number (3) indicates the head number, and the last number (1) indicates the beam number. In this identification pattern ID, any type of character including the alphabet, the number, and katakana may be used, and signs and the like may be used. When, for example, the first electrode 13 is formed of the reflecting electrode, the identification pattern ID may be made of the same material as that of the first electrode 13. In addition, the identification pattern ID made of a metal layer may be formed independently of the first electrode 13.

Figure 5:
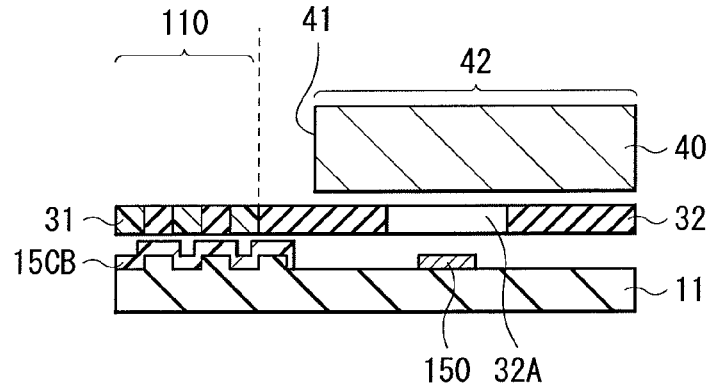
FIG. 5 is a cross-sectional view taken along a line V-V of FIG. 4.

FIG. 5 illustrates a cross-sectional structure taken along a line V-V of FIG. 4. The shielding layer 32 on the sealing substrate 30 is formed in the whole region except the effective region 110, but it is desirable that a window 32A be provided corresponding to the inspection region 150. This is because in a manufacturing process to be described later, it is possible to perform the inspection by using the inspection region 150 after sealing with the sealing substrate 30 is carried out.

Further, the drive substrate 11 and the sealing substrate 30 are accommodated in a housing 40. This housing 40 has an opening 41 corresponding to the effective region 110, and around this opening 41, a frame section 42 is provided. It is preferable that the frame section 42 conceal the inspection region 150 and the window 32A.

Manufacturing Method of Display Device

This display device can be produced as follows, for example.

Figure 6:
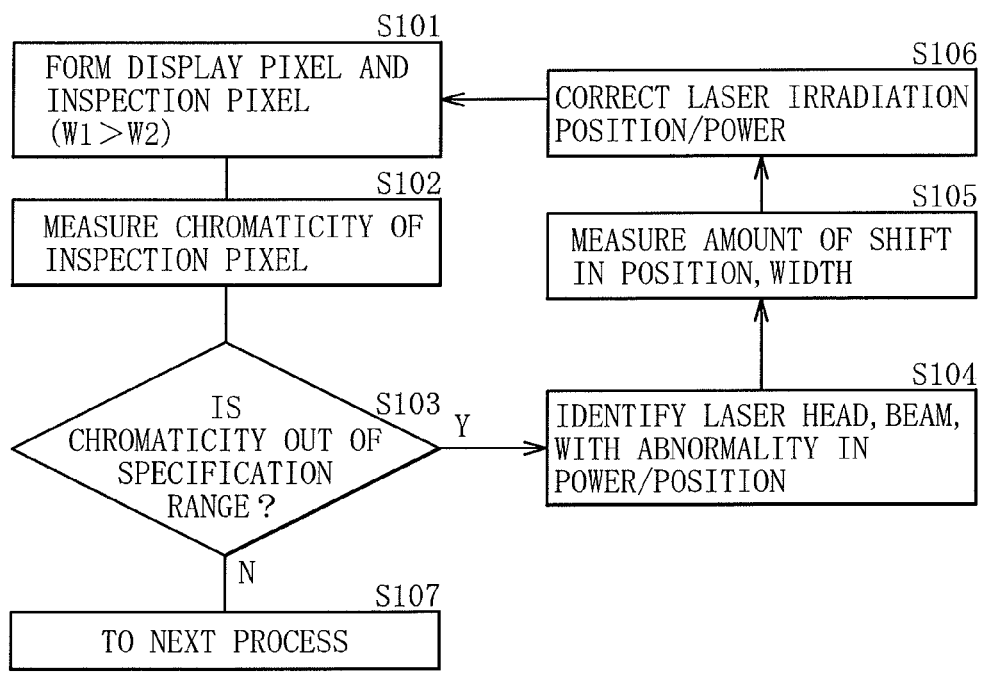
FIG. 6 is a diagram illustrating a flow of a manufacturing method of the display device illustrated in FIG. 1.
Figure 7:
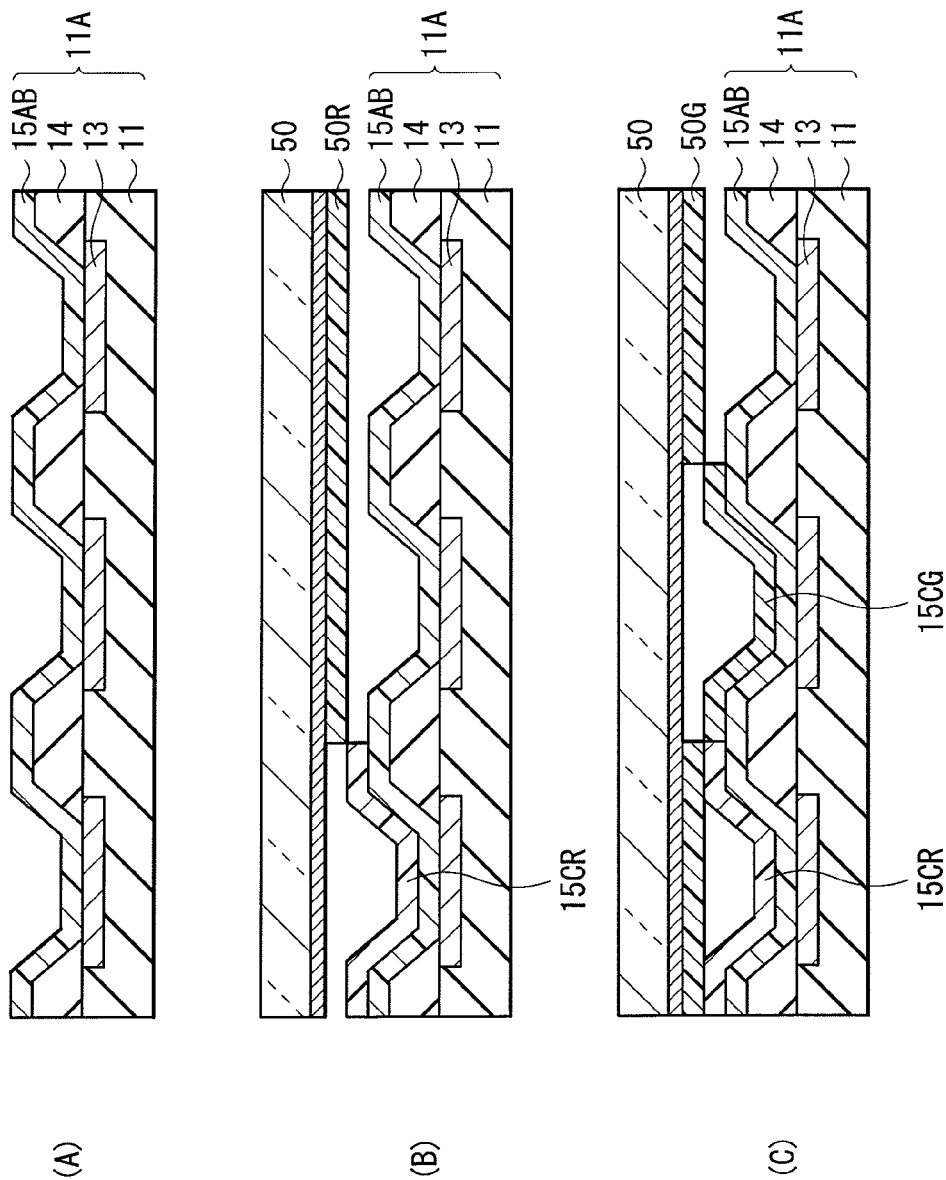
FIG. 7 is a cross-sectional view illustrating a part of the manufacturing method illustrated in FIG. 6 in process order.

FIG. 6 illustrates a flow of the manufacturing method of this display device, and FIG. 7 illustrates a part of this manufacturing method in process order. At first, as illustrated in FIG. 7(A), on the drive substrate 11, the first electrode 13, the insulating layer 14 and the hole injection layer and hole transport layer 15AB are formed and therefore a transferred substrate 11A is formed.

In other words, after the drive substrate 11 made of the material described above is prepared and the pixel drive circuit 140 is formed on this drive substrate 11, a planarizing dielectric film (not illustrated) is formed by applying the photosensitive resin to the entire surface, patterning to form a predetermined shape is carried out with exposure and development, a connection aperture (not illustrated) for the drive transistor Tr1 and the first electrode 13 is formed, and firing is performed.

Subsequently, the first electrode 13 made of the material descried above is formed by, for example, sputtering, and molded into a predetermined shape by, for example, dry etching. Incidentally, at a predetermined position of the drive substrate 11, an alignment mark used for alignment with the donor substrate in a transfer process to be described later may be formed. At the time, in the effective region 110, the first electrodes 13 of the display pixels Px1 are formed in rows and columns, and in the same process, in the inspection region 150, the first electrodes 13 of the inspection pixels Px2, the inspection patterns Pm with scale and the identification patterns ID are formed.

Subsequently, the insulating layer 14 is formed on the entire surface of the drive substrate 11, and the opening section corresponding to the light emitting region 13A of the first electrode 13 is formed by, for example, a photolithography method. At the time, the distance W2 between the first electrodes 13 of the inspection pixels Px2 on both sides of the color targeted for the inspection is made to be shorter than the distance W1 between the first electrodes 13 of the display pixels Px1 on both sides of the color targeted for the inspection.

Subsequently, the hole injection layer and hole transport layer 15AB having the above-described thickness and made of the described-above materials is sequentially formed to be a film by, for example, a vapor deposition method using an area mask. Thus, the transferred substrate 11A is formed.

After the transferred substrate 11A is formed, as illustrated in FIG. 7(B), a red transfer layer 50R is formed on the donor substrate 50 by, for example, the vapor deposition method, and the red transfer layer 50R is disposed to face the transferred substrate 11A. Subsequently, by the laser transfer method of irradiating the back surface side of the donor substrate 50 with a laser beam, and sublimating or vaporizing the red transfer layer 50R, and thereby transferring the red transfer layer 50R to the transferred substrate 11A, the red-light emission layer 15CR is formed straight in the column direction to extend beyond the effective region 110, reach the inspection region 150, and intersect the inspection pattern Pm with scale.

After the red-light emission layer 15CR is formed, as illustrated in FIG. 7(C), in a manner similar to the red-light emission layer 15CR, a green transfer layer 50G on the donor substrate 50 is transferred to the transferred substrate 11A, and therefore the green-light emission layer 15CG is formed.

After the green-light emission layer 15CG is formed, the donor substrate 50 and the transferred substrate 11A are separated from each other, and on the transferred substrate 11A, the blue-light emission layer 15CB, the electron transport layer and electron injection layer 15DE, and the second electrode 16 are formed by, for example, vapor deposition. In this way, the display pixels Px1 and the inspection pixels Px2 made up of the organic light-emitting elements 10R, 10G and 10B are formed (step S101).

After the display pixels Px1 and the inspections pixel Px2 are formed, the protective film 17 made of the material described above is formed thereon. As the formation method of the protective film 17, a film formation method in which energy of film formation particles is small, to the extent of not affecting the base, for example, vapor deposition method or CVD method is desirable. Further, it is desirable that the protective film 17 be treated sequentially from the formation of the second electrode 16, without exposing the second electrode 16 to the atmosphere. This is because it is possible to restrain deterioration of the organic layer 15 due to water and oxygen in the atmosphere. Furthermore, in order to prevent a decrease in the luminance due to the deterioration of the organic layer 15, it is desirable that a film formation temperature of the protective film 17 be set to an ordinary temperature, and the film formation be performed under a condition to minimize the stress of the film to prevent peeling of the protective film 17.

In addition, for example, on the sealing substrate 30 made of the material described above, the material of the red filter is put by spin coating or the like, and the red filter is formed by being patterned by photolithography and fired. Subsequently, in a manner similar to the red filter, the blue filter and the green filter are formed sequentially.

Thereafter, on the protective film 17, the adhesive layer 20 is formed, and the sealing substrate 30 is affixed with this adhesive layer 20 in between and therefore sealing is made. At the time, it is desirable to dispose the sealing substrate 30 with the surface where the color filter 31 and the shielding layer 32 are formed being directed to the organic light-emitting elements 10R, 10G and 10B side.

Subsequently, the inspection pixel Px2 is caused to emit the light with EL or PL, and a chromaticity or a spectrum shape is measured by using the window 32A of the shielding layer 32 (step S102).

Subsequently, it is determined whether the measured chromaticity or spectrum shape is out of a specification range (step S103). As described above, the distance W2 between the inspection pixels Px2 on both sides of the color targeted for the inspection is set to be the process control upper limit of the lateral-ends position of the red-light emission layer 15CR or the green-light emission layer 15CG, which is determined by the transfer position and the size. Therefore, when the lateral-ends position of the red-light emission layer 15CR or the green-light emission layer 15CG exceeds the process control upper limit, extension to the inspection pixel Px2 (color mixture) occurs, and the chromaticity or the spectrum shape of the EL or PL light emission of the inspection pixel Px2 changes, becoming out of the specification range. When the color mixture occurs in the inspection pixel Px2, color mixture has yet to take place in the corresponding display pixel Px1, but it can be said that there is potential color mixture that is highly likely to take place. By using the inspection pixel Px2, the display pixel Px1 with potential color mixture can be found.

Specifically, in FIG. 4, when the lateral-ends position of the red-light emission layer 15CR does not exceed the process control upper limit, the inspection pixel Px2 on the left side becomes green because the green-light emission layer 15CG and the blue-light emission layer 15CB common to all the pixels are formed thereon, and the inspection pixel Px2 on the right side becomes blue because the blue-light emission layer 15CB common to all the pixels is formed thereon. However, when misregistration occurs in the red-light emission layer 15CR, even at a stage where color mixture has yet to take place in the display pixel Px1, red color mixture occurs in the inspection pixel Px2.

Usually, there is a time lag after the laser transfer is performed in a certain transferred substrate 11A until the transferred substrate 11A comes to the inspection. Therefore, the laser transfer is carried out for a large number of transferred substrates 11A before the misregistration is found, and a large number of defective panels may be produced. In this manufacturing method, it is possible to grasp, before color-mixture failure occurs in the effective region 110, a sign of misregistration of the red-light emission layer 15CR or the green-light emission layer 15CG, and thereby to take the following measures against the color-mixture failure at an early stage.

When it is determined that the chromaticity or the spectrum shape is out of the specification range (step S103: Y), a laser head or a laser beam used in the process to form the corresponding red-light emission layer 15CR or the corresponding green-light emission layer 15CG is identified by using the identification pattern ID (step S104).

Subsequently, the amount of a shift of the position of the corresponding red-light emission layer 15CR or the corresponding green-light emission layer 15CG is measured (step S105). The amount of the shift can be measured easily by using, for example, the inspection pattern Pm with scale. Specifically, when the inspection pattern Pm with scale is irradiated with light, in a part overlapping the red-light emission layer 15CR or the green-light emission layer 15CG, the chromaticity or the spectrum shape of the reflected light or the PL light emission changes by an interference effect. By reading a mark on the scale indicating the position corresponding to the change in the chromaticity or the spectrum shape, the position or the width of the red-light emission layer 15CR or the green-light emission layer 15CG is found, and it is possible to easily measure the amount of misregistration as well. Therefore, before a failure such as color mixture or uniformity of film thickness distribution is caused, it is possible to find a sign such as misregistration of the red-light emission layer 15CR or the green-light emission layer 15CG at an early stage.

Subsequently, based on the measured amount of the shift, the irradiation position or the power of the laser head or the laser beam is corrected (step S106) and used in the laser transfer process again (step S101).

When it is determined that the chromaticity or the spectrum shape is in the specification range (step S103: N), the panel proceeds to the next process (step S107), and the drive substrate 11 and the sealing substrate 30 are accommodated in the housing 40.

This completes the display device illustrated in FIG. 1 and FIG. 5.

In the manufacturing method described above, the case in which the misregistration of the red-light emission layer 15CR or the green-light emission layer 15CG is found has been described, but color mixture also occurs in the inspection pixel Px2 when the width of the red-light emission layer 15CR or the green-light emission layer 15CG is too large. Therefore, it is possible to find the excess of the width of the red-light emission layer 15CR and the green-light emission layer 15CG by the manufacturing method described above in a manner similar to the misregistration.

In the display device obtained in this way, the scanning signal is supplied through the gate electrode of the write transistor Tr2 to each pixel from the scanning-line drive circuit 130, and the image signal from the signal-line drive circuit 120 is held by the retention capacity Cs through the write transistor Tr2. In other words, the drive transistor Tr1 is subjected to on-off control according to the signal held by this retention capacity Cs, which causes injection of a driving current Id into each of the organic light-emitting elements 10R, 10G and 10B, and the hole and the electron are recombined to thereby cause the light emission. In the organic light-emitting element 10R, the red-light emission layer 15CR and the blue-light emission layer 15CB are formed, but energy transfer to the red color of the lowest energy level occurs, and the red-light emission becomes dominant. In the organic light-emitting element 10G, the green-light emission layer 15CG and the blue-light emission layer 15CB are formed, but energy transfer to the green color of a lower energy level occurs, and the green-light emission becomes dominant. In the organic light-emitting element 10B, only the blue-light emission layer 15CB is provided and thus, the blue-light emission occurs. This light passes through the second electrode 16, the color filter and the sealing substrate 30 and is taken out.

In this way, in the present embodiment, the inspection pixels Px2 composed of the organic light-emitting elements 10R, 10G and 10B are provided in the inspection region 150 outside of the effective region 110, the distance W2 between the inspection pixels Px2 on both sides of the color targeted for the inspection is made to be shorter than the distance W1 between the display pixels Px1 on both sides of the color targeted for the inspection and thus, based on the change in the chromaticity or the spectrum shape of the EL or PL light emission of this inspection pixel Px2, it is possible to find the sign such as the misregistration of the red-light emission layer 15CR, the green-light emission layer 15CG at an early stage. Therefore, yield is improved, and quality improvement is expected. In addition, provision of transfer conditions at the time of starting the mass production line operation becomes easy, leading to a reduction in the start-up time.

Further, in the inspection region 150, the inspection pattern Pm with scale including the reflecting layer is provided, and this inspection pattern Pm with scale is formed straight in the row direction to cover the column of the color targeted for the inspection and at least a part of the columns on both sides thereof and therefore, by reading a mark on the scale indicating the position of a change in the chromaticity or the spectrum shape of the reflected light or the PL light emission of the inspection pattern Pm with scale, it is possible to find the sign such as the misregistration of the red-light emission layer 15CR, the green-light emission layer 15CG at an early stage, and also the amount of the shift can be readily measured.

Modifications of the present embodiment will be described as follows.

<2. Modification 1>

In the embodiment described above, there has been described the case in which after the inspection pixel Px2 and the inspection pattern Pm with scale are used together, and the misregistration of the red-light emission layer 15CR, the green-light emission layer 15CG, is checked by using the inspection pixel Px2, and the amount of the shift is measured by using the inspection pattern Pm with scale, but it is possible to omit the inspection pattern Pm with scale and measure the amount of the shift by, for example, a length measuring machine. Further, without actually measuring the amount of the shift, by assuming the distance between the transfer position of the target and the inspection pixel Px2 to be the amount of a shift, the irradiation position or the power of the laser head or the laser beam may be corrected based on such an amount of the shift. Incidentally, it is desirable to use the inspection pattern Pm with scale concurrently, because the time and effort for the measurement with the length measuring machine can be omitted.

<3. Modification 2>

Figure 8:
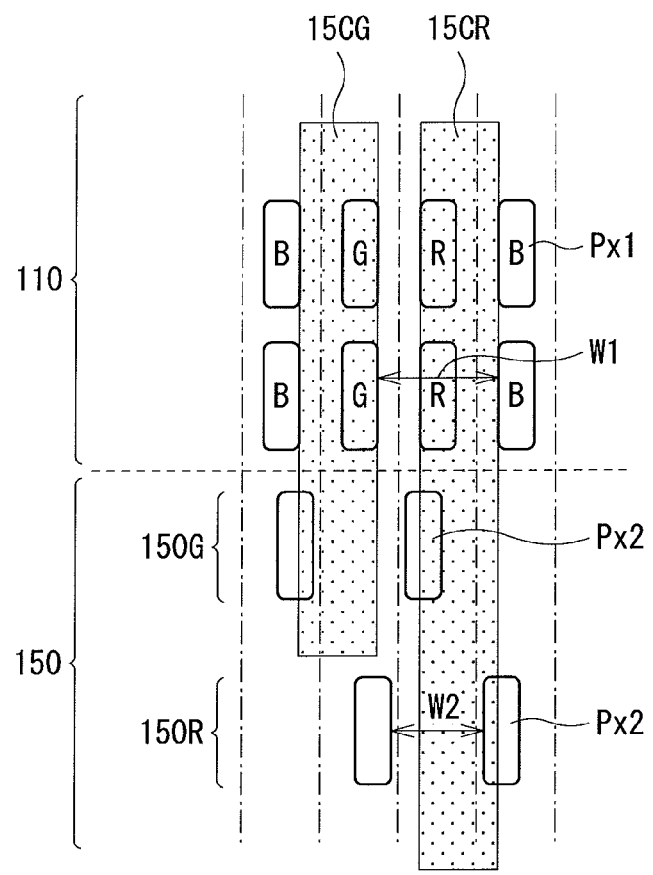
FIG. 8 is a plan view illustrating a configuration of an inspection region according to a modification 2 of the present invention.

Furthermore, in the embodiment described above, there has been described the case in which the inspection pixel Px2 is provided in the same column as the column of the display pixels Px1 on each of both sides of the color targeted for the inspection, and has the width wider than that of the display pixel Px1, but as illustrated in FIG. 8, the inspection pixel Px2 may be provided in the same column as the column of the display pixels Px1 on each of both sides of the color targeted for the inspection, and may be shifted in the position in the row direction with respect to the display pixel Px1 in the same columns. In other words, the inspection pixel Px2 may be moved toward the column of the display pixels Px1 of the color targeted for the inspection. In this way as well, the distance W2 between the inspection pixels Px2 on both sides of the color targeted for the inspection can be made shorter than the distance W1 between the display pixels Px1 on both sides of the color targeted for the inspection. Incidentally, in the present modification and the following modifications, the inspection pattern Pm with scale may be used concurrently like the embodiment described above, and the inspection pattern Pm with scale may be omitted like the modification 1.

<4. Modification 3>

Figure 9:
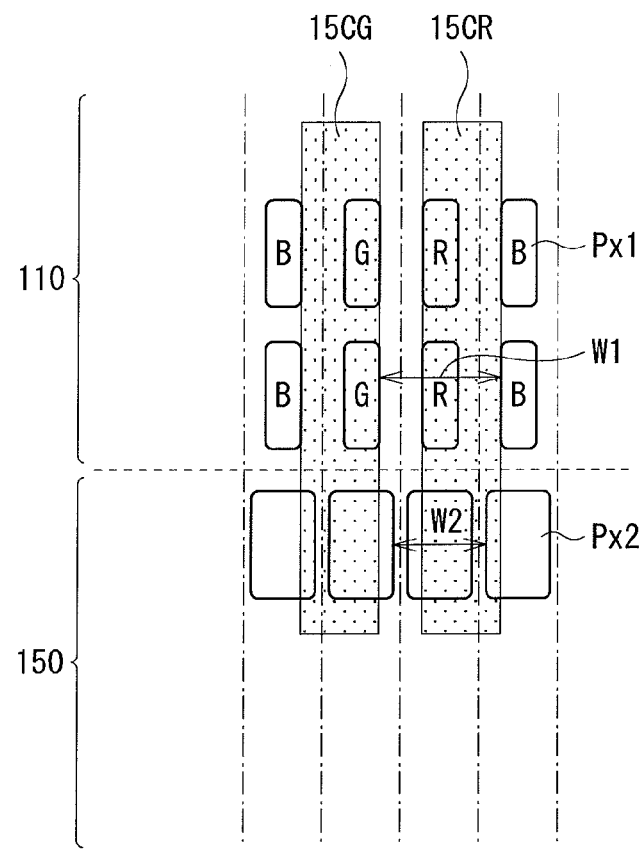
FIG. 9 is a plan view illustrating a configuration of an inspection region according to a modification 3 of the present invention.

Furthermore, in the embodiment described above, there has been described the case in which the inspection pixels Px2 are arranged to be staggered for each color targeted for the inspection, but when there is no problem in wiring space, as illustrated in FIG. 9, the inspection pixels Px2 may be arranged laterally in a row without being staggered. In this case however, there is a possibility that the red-light emission layer 15CR and the green-light emission layer 15CG may overlap the same inspection pixel Px2, making the color-mixture evaluation difficult and thus, the staggered arrangement is preferable.

<5. Modification 4>

Figure 10:
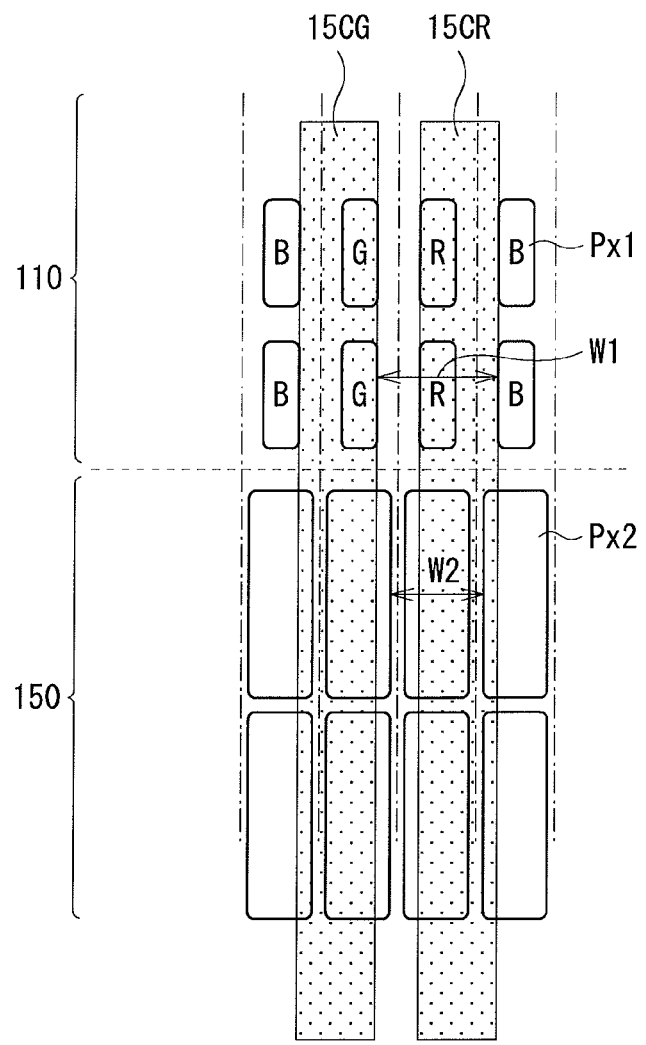
FIG. 10 is a plan view illustrating a configuration of an inspection region according to a modification 4 of the present invention.

In addition, as illustrated in FIG. 10, the long-side size and the number of the inspection pixels Px2 are not particularly limited.

<6. Modification 5>

Figure 11:
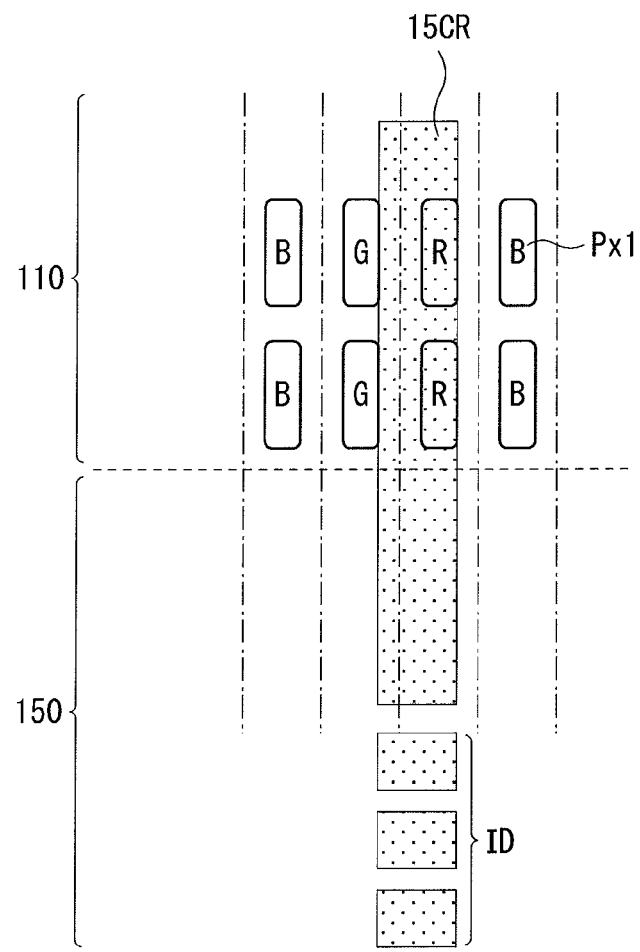
FIG. 11 is a plan view illustrating a configuration of an inspection region according to a modification 5 of the present invention.

Furthermore, in the embodiment described above, the letters, numbers and the like are used as the identification pattern ID, but as illustrated in FIG. 11, an intermittence pattern may be formed in the red-light emission layer 15CR or the green-light emission layer 15CG by the on-off control of the laser, and this intermittence pattern may be used as the identification pattern ID.

<7. Modification 6>

Figure 12:
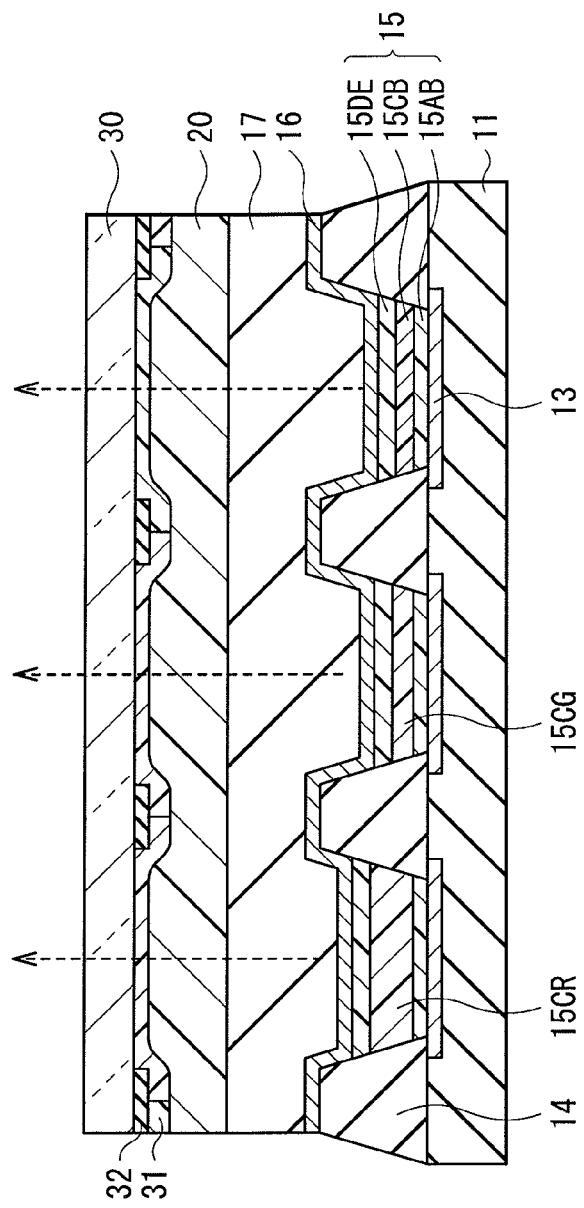
FIG. 12 is a cross-sectional view illustrating a configuration of an inspection region according to a modification 6 of the present invention.
Figure 13:
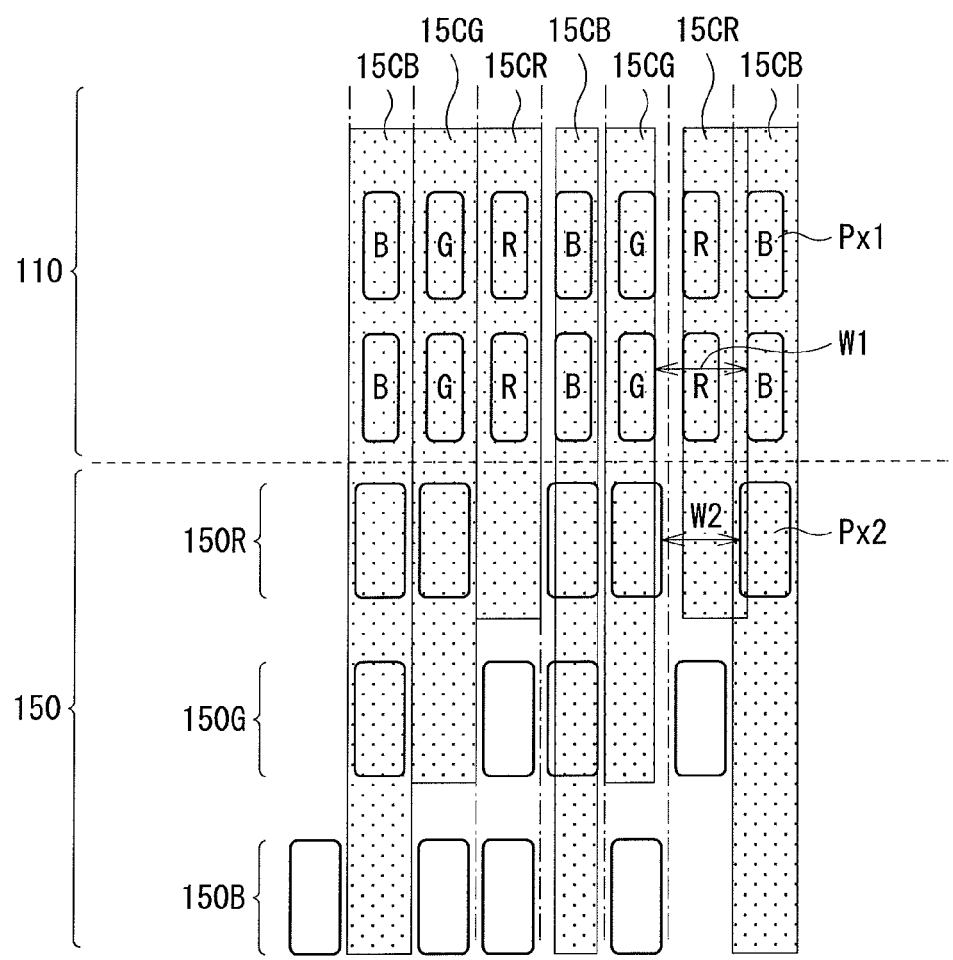
FIG. 13 is a plan view illustrating a configuration of an inspection region according to the modification 6 of the present invention.

In addition, in the embodiment described above, there has been described the case in which the red-light emission layer 15CR and the green-light emission layer 15CG are formed by the laser transfer method, but as illustrated in FIG. 12, all of the red-light emission layer 15CR, the green-light emission layer 15CG and the blue-light emission layer 15CB may be formed by the laser transfer method. In that case, as illustrated in FIG. 13, a blue (B) evaluation region 150B having the inspection pixels Px2 on both sides of the blue-light emission layer 15CB can be provided. Further, desirably, the shorter the wavelength of the color targeted for the inspection is, the farther position away from the effective region 110 the inspection pixel Px2 is formed in. Incidentally, when all of the red-light emission layer 15CR, the green-light emission layer 15CG and the blue-light emission layer 15CB are formed by the laser transfer method, not all the inspection pixels Px2 have the light emission layers formed thereon and thus, there may be an inspection pixel Px2 that only has the first electrode 13 and the second electrode 16.

<8. Modification 7>

Figure 14:
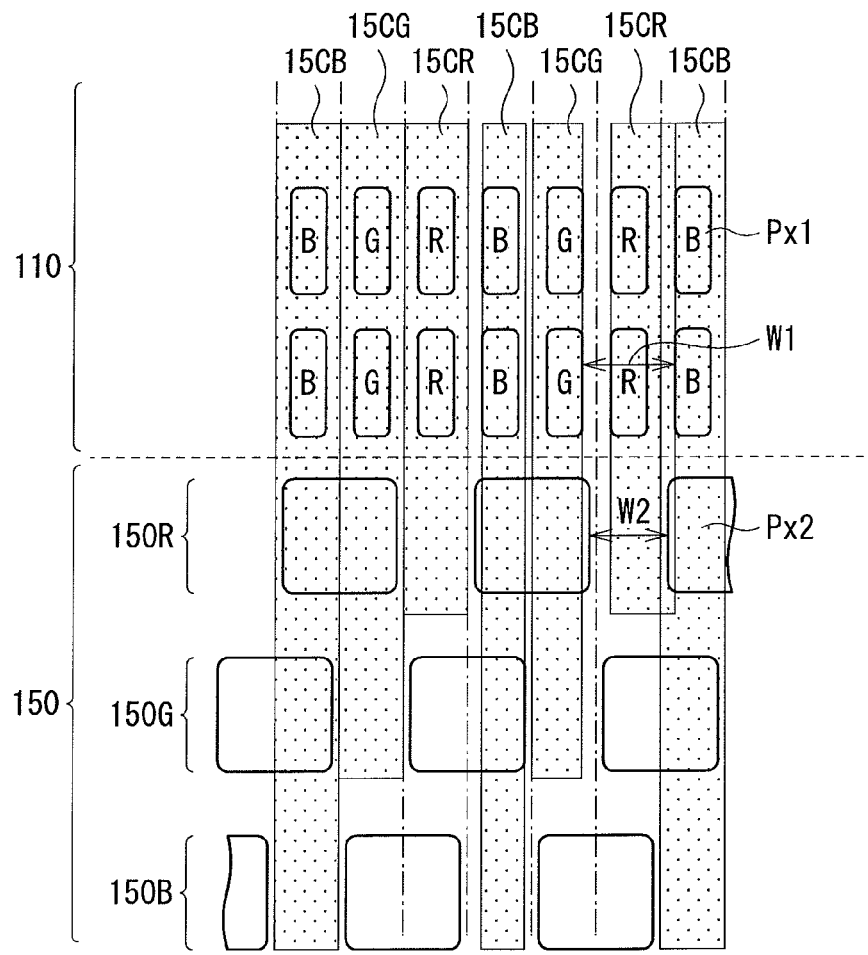
FIG. 14 is a plan view illustrating an example of the arrangement of an inspection region according to a modification 7 of the present invention.

In addition, in the modification 6, as illustrated in FIG. 14, the width of the inspection pixel Px2 may be increased, so that the light emission layers of two or more colors may be formed in the single inspection pixel Px2.

<9. Modification 8>

Figure 15:
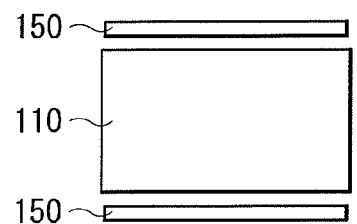
FIG. 15 is a plan view illustrating a configuration of an inspection region according to a modification 8 of the present invention.
Figure 16:
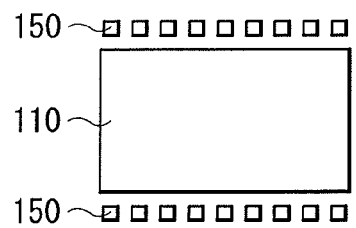
FIG. 16 is a plan view illustrating another example of the arrangement of the inspection region.
Figure 17:
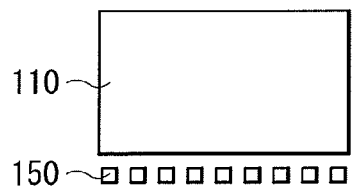
FIG. 17 is a plan view illustrating yet another example of the arrangement of the inspection region.
Figure 18:
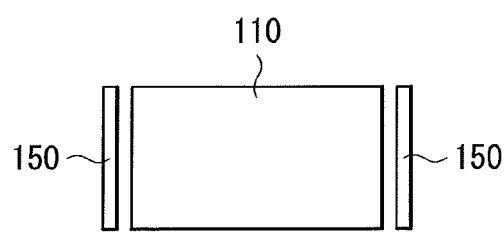
FIG. 18 is a plan view illustrating yet another example of the arrangement of the inspection region.
Figure 19:
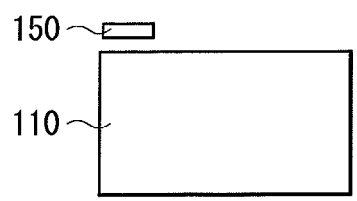
FIG. 19 is a plan view illustrating yet another example of the arrangement of the inspection region.
Figure 20:
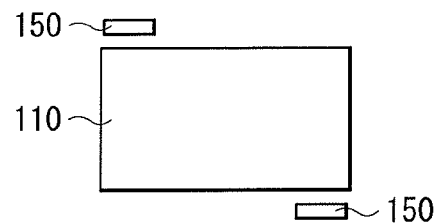
FIG. 20 is a plan view illustrating yet another example of the arrangement of the inspection region.
Figure 21:
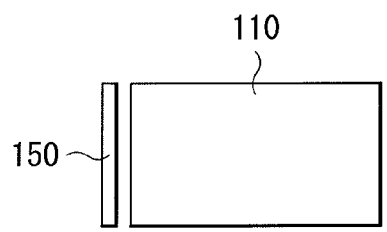
FIG. 21 is a plan view illustrating yet another example of the arrangement of the inspection region.
Figure 22:
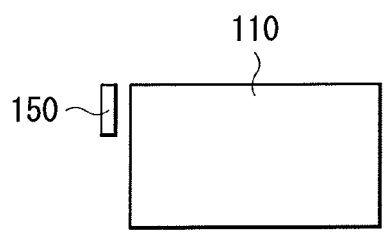
FIG. 22 is a plan view illustrating yet another example of the arrangement of the inspection region.
Figure 23:
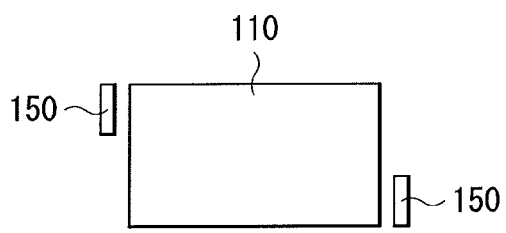
FIG. 23 is a plan view illustrating yet another example of the arrangement of the inspection region.

Furthermore, the arrangement of the inspection region 150 is not particularly limited, and various ways of arrangement as illustrated in FIG. 15 to FIG. 23 are possible. In particular, as illustrated in FIG. 15, it is desirable that the inspection region 150 be provided in the opposite long side of the effective region 110. This is because even when the scanning track of a laser beam is shifted obliquely, this can be detected easily. Moreover, when a multi-head is used, the transferred substrate 11A of each head is divided into areas and the laser transfer process is performed and thus, the inspection region 150 may be provided for each area corresponding to each head. Incidentally, it goes without saying that the arrangement of the inspection process 150 may be any other than those illustrated in FIG. 15 to FIG. 23.

<10. Second Embodiment>

[Display Device]

Figure 24:
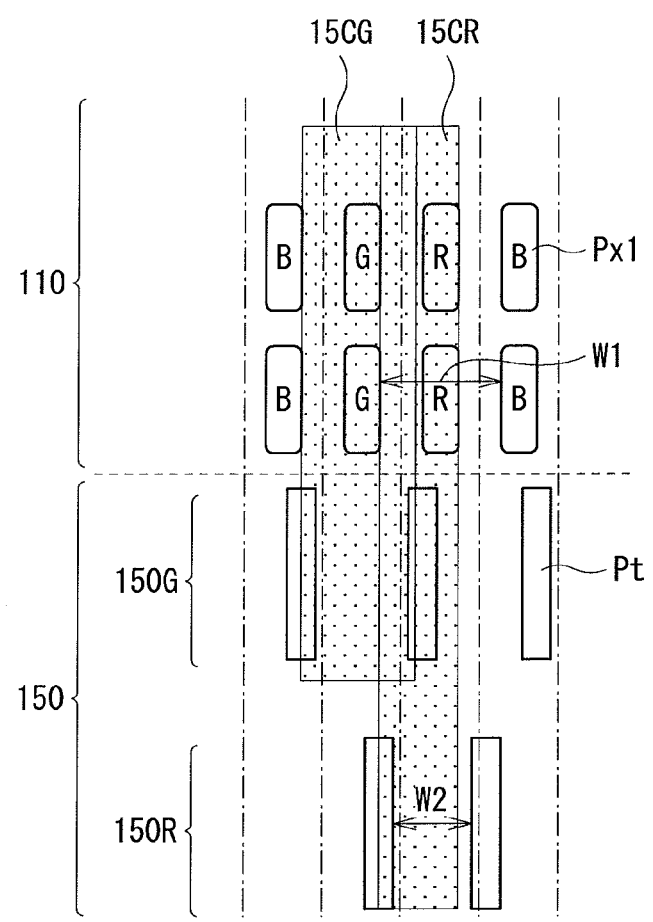
FIG. 24 is a plan view illustrating a configuration of a display region according to a second embodiment of the present invention.

FIG. 24 illustrates an example of the plane configuration of an effective region 110 of a display device according to the second embodiment of the present invention. This display device has the configuration like the first embodiment except that an inspection pattern Pt including a reflecting layer is formed in place of the inspection pixel Px2. Therefore, the equivalent elements will be given the same signs and described.

The inspection pattern Pt is a color-mixture checking pattern to early find a sign of misregistration of the red-light emission layer 15CR and the green-light emission layer 15CG formed by the laser transfer method and, for example, is formed straight in the column direction. In the red (R) evaluation region 150R, the inspection patterns Pt are formed on both sides of the red-light emission layer 15CR. In the green (G) evaluation region 150G, the inspection patterns Pt are formed on both sides of the green-light emission layer 15CG.

The distance W2 between the inspection patterns Pt on both sides of the color targeted for the inspection is shorter than the distance W1 between the display pixels Px1 on both sides of the color targeted for the inspection. Thus, in this display device, it is possible to early find the misregistration of the red-light emission layer 15CR, the green-light emission layer 15CG.

Specifically, the distance W2 between the inspection patterns Pt on both sides of the color targeted for the inspection is set to be a process control upper limit of the lateral-ends position of the red-light emission layer 15CR, and the green-light emission layer 15CG, which is determined by the transfer position and the size. For example, when the first electrode 13 is formed of a reflecting electrode, such an inspection pattern Pt may be made of the same material as the first electrode 13. In addition, the reflecting layer may be provided independently of the first electrode 13.

It is desirable that the inspection pattern Pt be staggered for each color targeted for the inspection. This is because it is easy to secure wiring space to the effective region 110. In addition, generally, when multiple colors are mixed, a color of a long wavelength emits the light predominantly. Therefore, when, for example, the red-light emission layer 15CR and the green-light emission layer 15CG overlap the same the inspection pattern Pt, the red-light emission becomes dominant, and the presence or absence of color mixture in the green color may become unclear. Therefore, to remove an influence of other color, it is desirable that the inspection patterns Pt be staggered by shifting the position for each color targeted for the inspection.

The inspection pattern Pt of the red (R) evaluation region 150R may be formed at a position further away from the effective region 110 than the inspection pattern Pt of the green (G) evaluation region 150G. This is because, as will be described later, the inspection pattern Pt does not produce the light emission like the inspection pixel Px2, and emits the light and carries out the inspection by using reflected light resulting from the emitted light or PL light emission. Even when color mixture takes place due to the green-light emission layer 15CG and the red-light emission layer 15CR overlapping the same inspection pattern Pt, the reflected light or the PL light emission becomes another color and thus, color-mixture evaluation of the green-light emission layer 15CG is not very difficult.

Incidentally, although omitted in FIG. 24, the inspection pattern Pm with scale, the identification pattern ID, the shielding layer 32 on the sealing substrate 30 and the housing 40 are similar to those of the first embodiment.

[Manufacturing Method Of Display Device]

This display device can be produced, for example, as follows.

Figure 25:
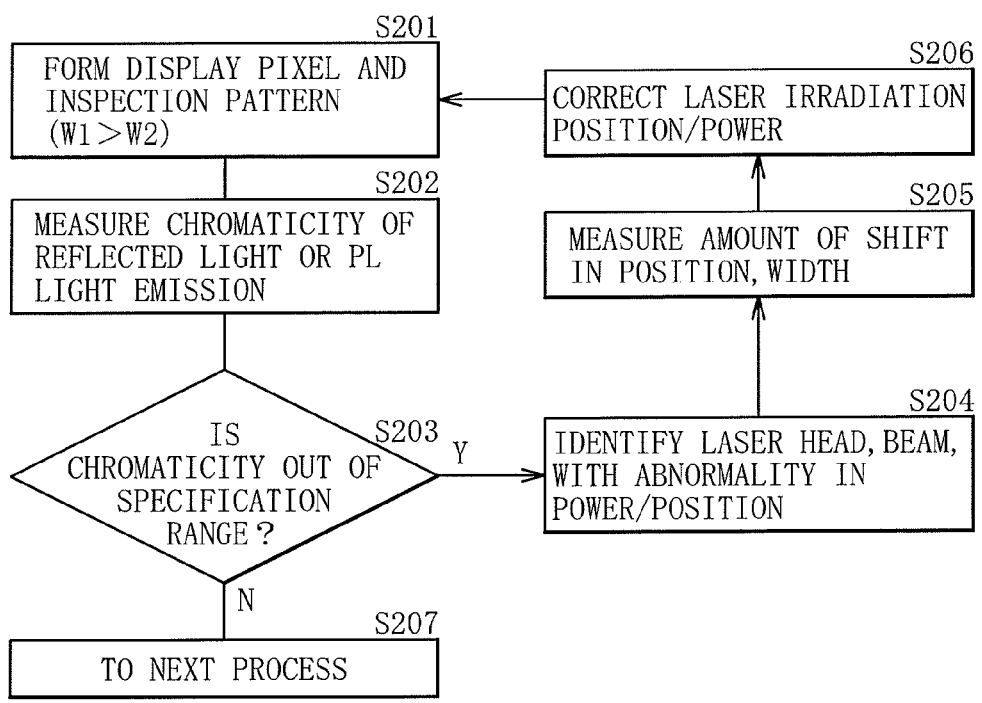
FIG. 25 is a diagram illustrating a flow of a manufacturing method of the display device illustrated in FIG. 24.

FIG. 25 illustrates a flow of the manufacturing method of this display device. Incidentally, a part overlapping the manufacturing process of the first embodiment will be described with reference to FIG. 7.

At first, as illustrated in FIG. 7(A), on the drive substrate 11, the first electrode 13, the insulating layer 14 and the hole injection layer and hole transport layer 15AB are formed and therefore the transferred substrate 11A is formed.

In other words, after the pixel drive circuit 140 and the planarizing dielectric film (not illustrated) are formed on the drive substrate 11, the first electrode 13 is formed. At the time, in the effective region 110, the first electrodes 13 of the display pixels Px1 are formed in a matrix, and in the same process, in the inspection region 150, the inspection pattern Pt, the inspection pattern Pm with scale, and the identification pattern ID are formed.

Subsequently, the insulating layer 14 is formed on the entire surface of the drive substrate 11, and the opening section corresponding to the light emitting region 13A of the first electrode 13 is formed by, for example, the photolithography method. At the time, the distance W2 between the inspection patterns Pt on both sides of the color targeted for the inspection is made to be shorter than the distance W1 between the first electrodes 13 of the display pixels Px1 on both sides of the color targeted for the inspection.

Subsequently, the hole injection layer and hole transport layer 15AB having the above-described thickness and made of the described-above materials is sequentially formed to be a film by, for example, the vapor deposition method using the area mask. Thus, the transferred substrate 11A is formed.

After the transferred substrate 11A is formed, in a manner similar to the first embodiment, in the processes illustrated in FIG. 7(B) and FIG. 7(C), the red-light emission layer 15CR and the green-light emission layer 15CG are formed by the laser transfer method.

After the green-light emission layer 15CG is formed, in a manner similar to the first embodiment, the blue-light emission layer 15CB, the electron transport layer and electron injection layer 15DE and the second electrode 16 are formed. In this way, the display pixels Px1 composed of the organic light-emitting elements 10R, 10G and 10B and the inspection patterns Pt are formed (step S201).

After the display pixels Px1 and the inspection patterns Pt are formed, in a manner similar to the first embodiment, the protective film 17 is formed thereon. Subsequently, the adhesive layer 20 is formed on the protective film 17, and with this adhesive layer 20 in between, the sealing substrate 30 on which the color filter 31 is formed is affixed and therefore sealing is made.

Subsequently, the inspection pattern Pt is irradiated with the light using the window 32A of the shielding layer 32, and the chromaticity or the spectrum shape of the reflected light or the PL light emission is measured (step S202).

Subsequently, it is determined whether the measured chromaticity or spectrum shape is out of the specification range (step S203). As described above, the distance W2 between the inspection patterns Pt on both sides of the color targeted for the inspection is set to be the process control upper limit of the lateral-ends position of the red-light emission layer 15CR or the green-light emission layer 15CG, which is determined by the transfer position and the size. Thus, when the lateral-ends position of the red-light emission layer 15CR or the green-light emission layer 15CG exceeds the process control upper limit, the red-light emission layer 15CR or the green-light emission layer 15CG is overlaid on the inspection pattern Pt. When the inspection pattern Pt is irradiated with the light, in the part overlapping the red-light emission layer 15CR or the green-light emission layer 15CG, the chromaticity or the spectrum shape of the reflected light or the PL light emission changes due to an interference effect, becoming out of the specification range. In that case, color mixture has yet to take place in the corresponding display pixel Px1, but it can be said that there is potential color mixture that is highly likely to take place. By using the inspection patterns Pt, the display pixel Px1 with potential color mixture can be found. In other words, it is possible to grasp, before a color-mixture failure occurs in the effective region 110, misregistration of the red-light emission layer 15CR or the green-light emission layer 15CG, and take the following measures against the color-mixture failure at an early stage.

When it is determined that the chromaticity or the spectrum shape is out of the specification range (step S203: Y), the laser head or the laser beam used in the process to form the corresponding red-light emission layer 15CR or the corresponding green-light emission layer 15CG is identified by using the identification pattern ID (step S204).

Subsequently, the amount of a shift in the position of the corresponding red-light emission layer 15CR or the corresponding green-light emission layer 15CG is measured (step S205). For example, by irradiating the inspection pattern Pm with scale with the light, and reading a mark on the scale indicating the position corresponding to the change in the chromaticity or the spectrum shape of the reflected light or the PL light emission, the amount of the shift can be easily measured.

Subsequently, based on the measured amount of the shift, the irradiation position or the power of the laser head or the laser beam is corrected (step S206) and used in the laser transfer process again (step S201).

When it is determined that the chromaticity or the spectrum shape is in the specification range (step S203: N), the panel proceeds to the next process (step S207), and the drive substrate 11 and the sealing substrate 30 are accommodated in the housing 40.

This completes the display device illustrated in FIG. 24.

Incidentally, in the manufacturing method described above, the case in which the misregistration of the red-light emission layer 15CR or the green-light emission layer 15CG is found has been described, a change in the spectrum shape of the reflected light or the PL light emission also occurs when the width of the red-light emission layer 15CR or the green-light emission layer 15CG is too wide. Therefore, it is possible to find the excess of the width of the red-light emission layer 15CR and the green-light emission layer 15CG by the manufacturing method described above in a manner similar to the misregistration.

The operation and effect of the present embodiment are similar to the first embodiment.

<11. Third Embodiment>
Display Device

Figure 26:
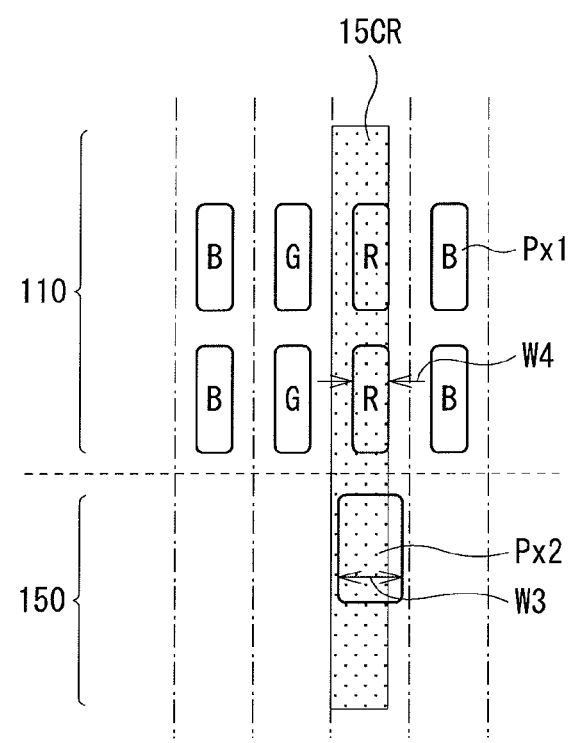
FIG. 26 is a plan view illustrating a configuration of an inspection region according to a third embodiment of the present invention.

FIG. 26 illustrates an example of the plane configuration of an effective region 110 of a display device according to the third embodiment of the present invention. In the present embodiment, a width shortage of the red-light emission layer 15CR, the green-light emission layer 15CG and the blue-light emission layer 15CB is detected by using the inspection pixel Px2. Except for this, this display device has the configuration similar to the first embodiment. Therefore, the equivalent elements will be given the same signs and described.

The inspection pixel Px2 is provided in the same column as the column of the display pixels Px1 of the color targeted for the inspection, and a width W3 of the inspection pixel Px2 is wider than a width W4 of the display pixel Px1. Thus, in this display device, it is possible to find a sign of the width shortage of the red-light emission layer 15CR or the green-light emission layer 15CG at an early stage.

The width W3 of the inspection pixel Px2 is, specifically, set to be a process control lower limit of the lateral-ends position of the red-light emission layer 15CR or the green-light emission layer 15CG, which is determined by the transfer position and the size.

Incidentally, although omitted in FIG. 26, the inspection pattern Pm with scale, the identification pattern ID, the shielding layer 32 on the sealing substrate 30 and the housing 40 are similar to those of the first embodiment.

Manufacturing Method of Display Device

This display device can be produced as follows, for example.

Figure 27:
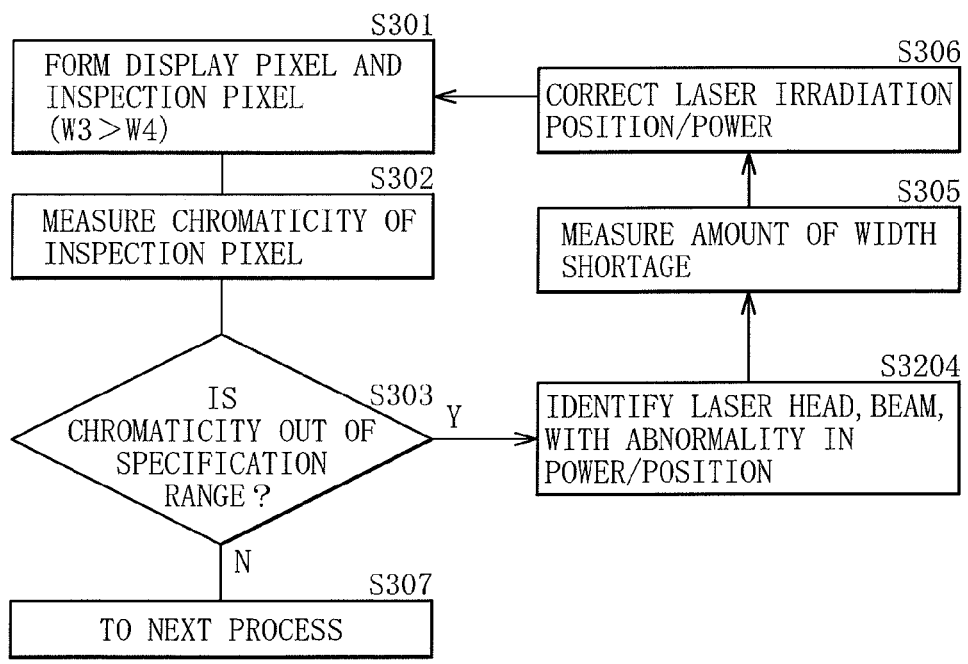
FIG. 27 is a diagram illustrating a flow of a manufacturing method of the display device illustrated in FIG. 26.

FIG. 27 illustrates a flow of the manufacturing method of this display device. Incidentally, a part overlapping the manufacturing process of the first embodiment will be described with reference to FIG. 7.

First, in a manner similar to the first embodiment, in the process illustrated in FIG. 7(A), on the drive substrate 11, the first electrode 13, the insulating layer 14 and the hole injection layer and hole transport layer 15AB are formed, and therefore the transferred substrate 11A is formed. At the time, in the process same as the first electrode 13 of the display pixel Px1, the first electrode 13 of the inspection pixel Px2, the inspection pattern Pm with scale, and the identification pattern ID are formed in the inspection region 150. The first electrode 13 of the inspection pixel Px2 is provided in the same column as the column of the first electrode 13 of the display pixel Px1 of the color targeted for the inspection. In addition, when the opening section is provided in the insulating layer 14, the width W3 of the inspection pixel Px2 is made to be wider than the width W4 of the display pixel Px1.

Then, in a manner similar to the first embodiment, in the processes illustrated in FIG. 7(B) and FIG. 7(C), the red-light emission layer 15CR and the green-light emission layer 15CG are formed by the laser transfer method.

Subsequently, in a manner similar to the first embodiment, the blue-light emission layer 15CB, the electron transport layer and electron injection layer 15DE and the second electrode 16 are formed. In this way, the display pixels Px1 composed of the organic light-emitting elements 10R, 10G and 10B and the inspection pixel Px2 are formed (step S301).

After the display pixel Px1 and the inspection pixel Px2 are formed, in a manner similar to the first embodiment, the protective film 17 is formed thereon. Subsequently, the adhesive layer 20 is formed on the protective film 17, and with this adhesive layer 20 in between, the sealing substrate 30 on which the color filter 31 is formed is affixed and therefore sealing is made.

Subsequently, by causing the inspection pixel Px2 to emit the light with EL or PL, and the chromaticity or the spectrum shape is measured by using the window 32A of the shielding layer 32 (step S302).

Subsequently, it is determined whether the measured chromaticity or spectrum shape is out of the specification range (step S303). As described above, the width W3 of the inspection pixel Px2 is set to be the process control lower limit of the lateral-ends position of the red-light emission layer 15CR or the green-light emission layer 15CG, which is determined by the transfer position and the size. Therefore, when the width of the red-light emission layer 15CR or the green-light emission layer 15CG is short, and the lateral-ends position is within the inspection pixel Px2, the chromaticity or the spectrum shape of the EL or PL light emission of the inspection pixel Px2 changes, becoming out of the specification range. In the corresponding display pixel Px1, a width shortage of the red-light emission layer 15CR or the green-light emission layer 15CG has not yet occurred, but there is a potential width shortage that is very likely to take place.

Specifically, in FIG. 26, when the width of the red-light emission layer 15CR is not short and the lateral-ends position is not within the inspection pixel Px2, the inspection pixel Px2 turns red. However, when the width of the red-light emission layer 15CR is short, even at a stage where no abnormality occurs in the display pixel Px1, blue color mixture occurs in the inspection pixel Px2. This is because in the inspection pixel Px2, the blue-light emission layer 15CB common to all pixels is formed.

In this way, by using the inspection pixel Px2, it is possible to find the display pixel Px1 with a potential width shortage. In other words, it is possible to grasp, before a failure occurs within the effective region 11, a width shortage of the red-light emission layer 15CR or the green-light emission layer 15CG, and take the following measures against occurrence of the width shortage at an early stage.

When it is determined that the chromaticity or the spectrum shape is out of the specification range (step S303:Y), the laser head or the laser beam used in the process to form the corresponding red-light emission layer 15CR or the corresponding green-light emission layer 15CG is identified by using the identification pattern ID (step S304).

Subsequently, the amount of the width shortage of the corresponding red-light emission layer 15CR or the corresponding green-light emission layer 15CG is measured (step S305). In a manner similar to the first embodiment, the amount of the width shortage can be measured easily by using the inspection pattern Pm with scale.

Subsequently, based on the measured amount of the width shortage, the irradiation position or the power of the laser head or the laser beam is corrected (step S306) and used in the laser transfer process again (step S301).

When it is determined that the chromaticity or the spectrum shape is in the specification range (step S303: N), the panel proceeds to the next process (step S307), and the drive substrate 11 and the sealing substrate 30 are accommodated in the housing 40.

This completes the display device illustrated in FIG. 26.

The operation and effect of the present embodiment are similar to those of the first embodiment.

In this way, in the present embodiment, in the inspection region 150 outside of the effective region 110, the inspection pixel Px2 formed of the organic light-emitting element 10R or 10G is provided in the same column as the column of the display pixels Px1 of the color targeted for the inspection, and the width W3 of the inspection pixel Px2 is made to be wider than that of the display pixel Px1 and thus, based on the change in the chromaticity or the spectrum shape of the EL or PL light emission of this inspection pixel Px2, it is possible to find the sign of the width shortage of the red-light emission layer 15CR or the green-light emission layer 15CG at an early stage. Incidentally, it goes without saying that by combining the first or second embodiment with the present embodiment or the following fourth embodiment, it is possible to inspect both of the width shortage and the misregistration as well as the width excess.

<12. Fourth embodiment>

Figure 28:
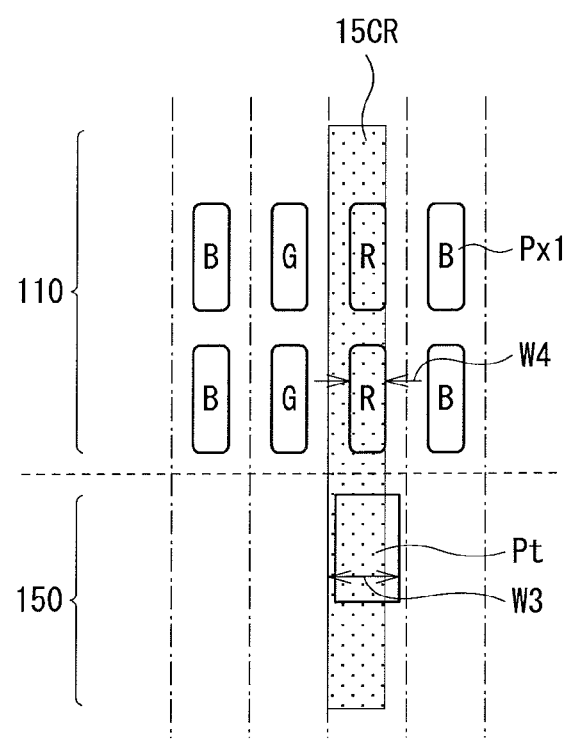
FIG. 28 is a plan view illustrating a configuration of an inspection region according to a fourth embodiment of the present invention.

Display device FIG. 28 illustrates an example of the plane configuration of an effective region 110 of a display device according to the fourth embodiment of the present invention. In the present embodiment, by using the inspection pattern Pt, a width shortage of the red-light emission layer 15CR, the green-light emission layer 15CG and the blue-light emission layer 15CB is detected. Except for this, this display device has the configuration similar to that of the first and second embodiments. Therefore, equivalent elements will be given the same signs and described.

The inspection pattern Pt is provided in the same column as the column of the display pixels Px1 of the color targeted for the inspection, the width W3 of the inspection pattern Pt is wider than the width W4 of the display pixel Px1. Thus, in this display device, it is possible to find a sign of a width shortage of the red-light emission layer 15CR and the green-light emission layer 15CG at an early stage.

The width W3 of the inspection pattern Pt is, specifically, set to be a process control lower limit of the lateral-ends position of red-light emission layer 15CR and the green-light emission layer 15CG, which is determined by the transfer position and the size.

Incidentally, although omitted in FIG. 28, the inspection pattern Pm with scale, the identification pattern ID, the shielding layer 32 in the sealing substrate 30 and the housing 40 are similar to those of the first embodiment.

Manufacturing Method of Display Device

This display device can be produced as follows, for example.

Figure 29:
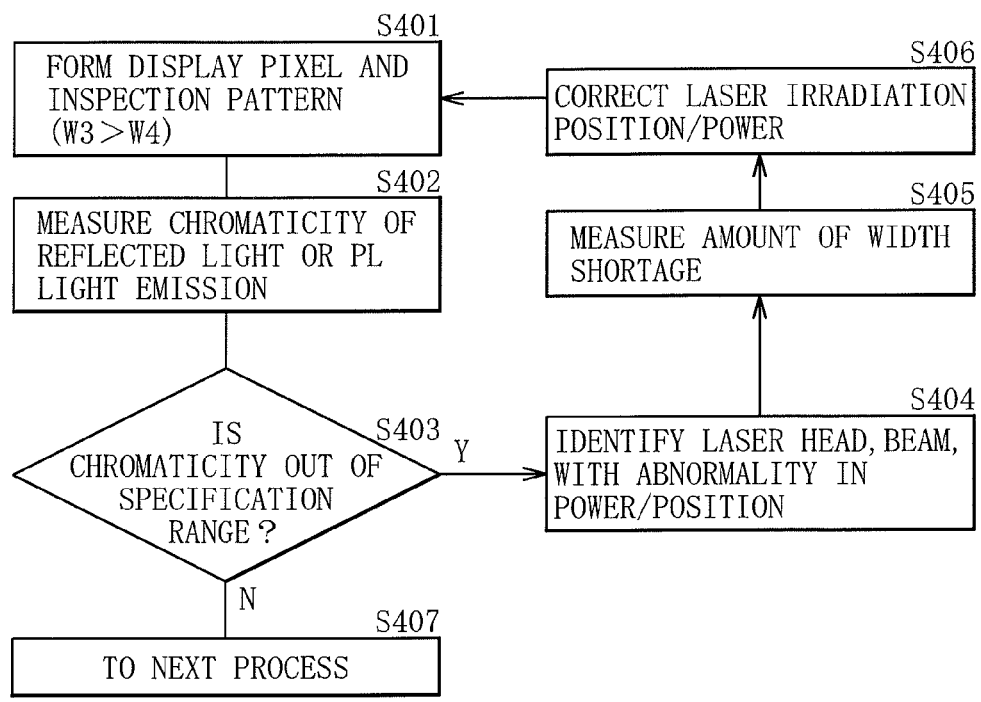
FIG. 29 is a diagram illustrating a flow of a manufacturing method of the display device illustrated in FIG. 28.

FIG. 29 illustrates a flow of the manufacturing method of this display device. Incidentally, a part overlapping the manufacturing process of the first embodiment will be described with reference to FIG. 7.

First, in a manner similar to the first embodiment and, in the process illustrated in FIG. 7(A), on the drive substrate 11, the first electrode 13, the insulating layer 14 and the hole injection layer and hole transport layer 15AB are formed, and therefore the transferred substrate 11A is formed. At the time, in the same process as the first electrode 13 of the display pixel Px1, in the inspection region 150, the inspection pattern Pt, the inspection pattern Pm with scale and the identification pattern ID are formed. The inspection pattern Pt is provided in the same column as the column of the first electrodes 13 of the display pixels Px1 of the color targeted for the inspection. In addition, when the opening section is provided in the insulating layer 14, the width W3 of the inspection pattern Pt is made to be wider than the width W4 of the display pixel Px1.

Subsequently, in a manner similar to the first embodiment, in the processes illustrated in FIG. 7(B) and FIG. 7(C), the red-light emission layer 15CR and the green-light emission layer 15CG are formed by the laser transfer method.

Subsequently, in a manner similar to the first embodiment, the blue-light emission layer 15CB, the electron transport layer and electron injection layer 15DE and the second electrode 16 are formed. In this way, the display pixels Px1 composed of the organic light-emitting elements 10R, 10G and 10B and the inspection pattern Pt are formed (step S401).

After the display pixels Px1 and the inspection pattern Pt are formed, in a manner similar to the first embodiment, the protective film 17 is formed thereon. Subsequently, the adhesive layer 20 is formed on the protective film 17, and with this adhesive layer 20 in between, the sealing substrate 30 on which the color filter 31 is formed is affixed and therefore sealing is made.

Subsequently, the inspection pattern Pt is irradiated with the light using the window 32A of the shielding layer 32, and the chromaticity or the spectrum shape of the reflected light or the PL light emission is measured (step S402).

Subsequently, it is determined whether the measured chromaticity or spectrum shape is out of the specification range (step S403). As described above, the width W3 of the inspection pattern Pt is set to be the process control lower limit of the lateral-ends position of red-light emission layer 15CR or the green-light emission layer 15CG, which is determined by the transfer position and the size. Therefore, when the width of the red-light emission layer 15CR or the green-light emission layer 15CG is short, and the lateral-ends position is on the inspection pattern Pt, the chromaticity or the spectrum shape of the reflected light or the PL light emission in the inspection pattern Pt changes, becoming out of the specification range. In the corresponding display pixels Px1, a width shortage of the red-light emission layer 15CR or the green-light emission layer 15CG has not yet occurred, but there is a potential width shortage that is very likely to take place. By using the inspection pattern Pt, it is possible to find the display pixel Px1 with the potential width shortage. In other words, it is possible to grasp, before a failure occurs in the effective region 110, the width shortage of the red-light emission layer 15CR or the green-light emission layer 15CG and take the following measures against occurrence of the width shortage at an early stage.

When it is determined that the chromaticity or the spectrum shape is out of the specification range (step S403:Y), the laser head or the laser beam used in the process to form the corresponding red-light emission layer 15CR or the corresponding green-light emission layer 15CG is identified by using the identification pattern ID (step S404).

Subsequently, the amount of the width shortage of the corresponding red-light emission layer 15CR or the corresponding green-light emission layer 15CG is measured (step S405). In a manner similar to the first embodiment, the amount of the width shortage can be easily measured by using the inspection pattern Pm with scale.

Subsequently, based on the measured amount of the width shortage, the irradiation position or the power of the laser head or the laser beam is corrected (step S406) and used in the laser transfer process again (step S401).

When it is determined that the chromaticity or the spectrum shape is in the specification range (step S403: N), the panel proceeds to the next process (step S407), and the drive substrate 11 and the sealing substrate 30 are accommodated in the housing 40. This completes the display device illustrated in FIG. 28.

The operation and effect of the present embodiment are similar to those of the third embodiment.

<13. Fifth Embodiment>

Display Device

Figure 30:
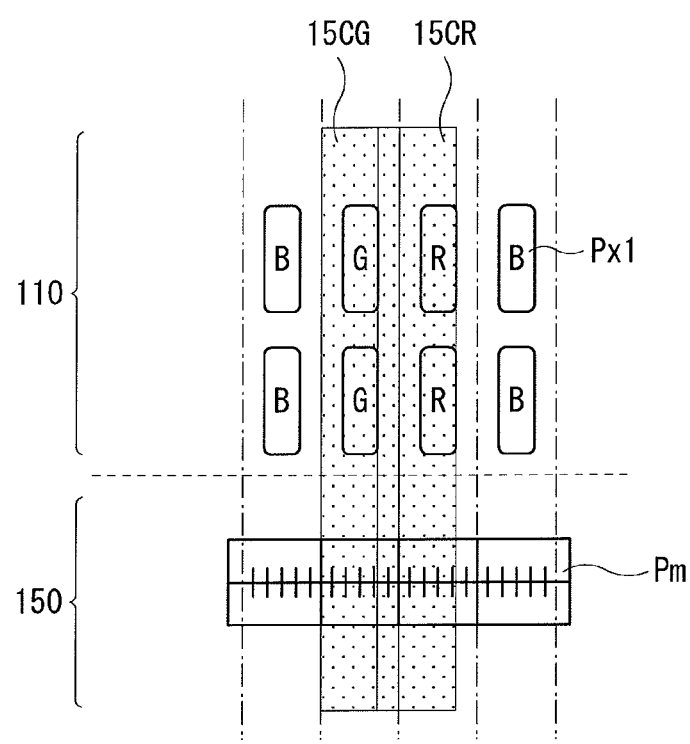
FIG. 30 is a plan view illustrating a configuration of an inspection region according to a fifth embodiment of the present invention.

FIG. 30 illustrates an example of the plane configuration of an effective region 110 of a display device according to the fifth embodiment of the present invention. In the present embodiment, the inspection pixel Px2 is omitted and the inspection is carried out by using the inspection pattern Pm with scale alone. Except for this, this display device has the configuration similar to that of the first embodiment.

Manufacturing Method of Display Device

This display device can be produced as follows, for example.

Figure 31:
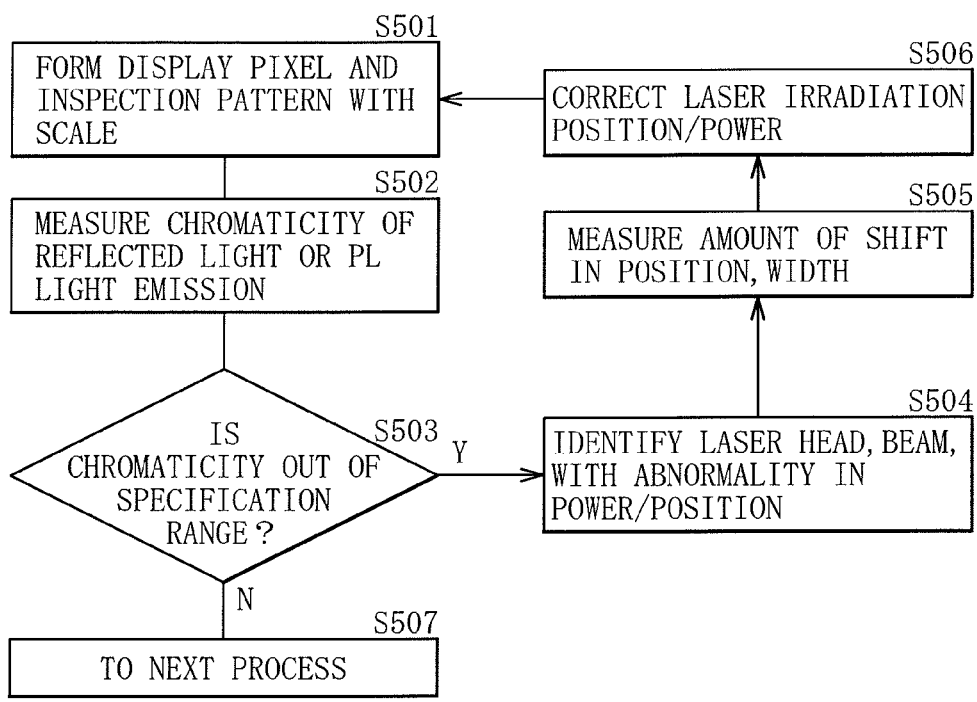
FIG. 31 is a diagram illustrating a flow of a manufacturing method of the display device illustrated in FIG. 30.

FIG. 31 illustrates a flow of the manufacturing method of this display device. Incidentally, a part overlapping the manufacturing process of the first embodiment will be described with reference to FIG. 7.

First, in a manner similar to the first embodiment, in the process illustrated in FIG. 7(A), on the drive substrate 11, the first electrode 13, the insulating layer 14 and the hole injection layer and hole transport layer 15AB are formed, and therefore the transferred substrate 11A is formed. At the time, in the same process as the first electrode 13 of the display pixel Px1, in the inspection region 150, the inspection pattern Pm with scale and the identification pattern ID are formed.

Subsequently, in a manner similar to the first embodiment, in the processes illustrated in FIG. 7(B) and FIG. 7(C), the red-light emission layer 15CR and the green-light emission layer 15CG are formed by the laser transfer method.

Subsequently, in a manner similar to the first embodiment, the blue-light emission layer 15CB, the electron transport layer and electron injection layer 15DE and the second electrode 16 are formed. In this way, the display pixels Px1 composed of the organic light-emitting elements 10R, 10G, and 10B and the inspection pattern Pm with scale are formed (step S501).

After the display pixels Px1 and the inspection pattern Pm with scale are formed, in a manner similar to the first embodiment, the protective film 17 is formed thereon. Subsequently, the adhesive layer 20 is formed on the protective film 17, and with this adhesive layer 20 in between, the sealing substrate 30 on which the color filter 31 is formed is affixed and therefore sealing is made.

Subsequently, the inspection pattern Pm with scale is irradiated with the light by using the window 32A of the shielding layer 32, and the chromaticity or the spectrum shape of the reflected light or the PL light emission is measured (step S502).

Subsequently, it is determined whether the measured chromaticity or spectrum shape is out of the specification range (step S503). Specifically, when the inspection pattern Pm with scale is irradiated with the light, in a part overlapping the red-light emission layer 15CR or the green-light emission layer 15CG, the chromaticity or the spectrum shape of the reflected light or the PL light emission is changed by an interference effect. By reading a mark on the scale indicating the position corresponding to the change in the chromaticity or the spectrum shape, the position or the width of the red-light emission layer 15CR or the green-light emission layer 15CG is made clear, and the amount of misregistration also can be measured easily. Therefore, before a failure such as color mixture or nonuniformity in film thickness distribution takes place, a sign such as the misregistration of the red-light emission layer 15CR or the green-light emission layer 15CG can be found at an early stage.

When it is determined that the chromaticity or the spectrum shape is out of the specification range (step S503: Y), the laser head or the laser beam used in the process to form the corresponding red-light emission layer 15CR or the corresponding green-light emission layer 15CG is identified by using the identification pattern ID (step S504).

Subsequently, the amount of the shift in the position of the corresponding red-light emission layer 15CR or the corresponding green-light emission layer 15CG is measured (step S505). In a manner similar to the first embodiment, the amount of the shift can be easily measured by using the inspection pattern Pm with scale.

Subsequently, based on the measured amount of the shift, the irradiation position or the power of the laser head or the laser beam is corrected (step S506), and used in the laser transfer process again (step S501).

When it is determined that the chromaticity or the spectrum shape is in the specification range (step S503: N), the panel proceeds to the next process (step S507), and the drive substrate 11 and the sealing substrate 30 are accommodated in the housing 40.

This completes the display device illustrated in FIG. 30.

The operation and effect of the present embodiment are similar to those of the first embodiment.

EXAMPLES

Further, specific examples of the present invention will be described.

Example 1

A display device was manufactured in a manner similar to the first embodiment described above. At the time, by using a 32-inch TFT substrate on a sixth-generation substrate as the transferred substrate 11A, and also by using eight laser heads having eight beams for one head in this transferred substrate 11A, the red-light emission layer 15CR and the green-light emission layer 15CG are formed by the laser transfer method.

Figure 32:
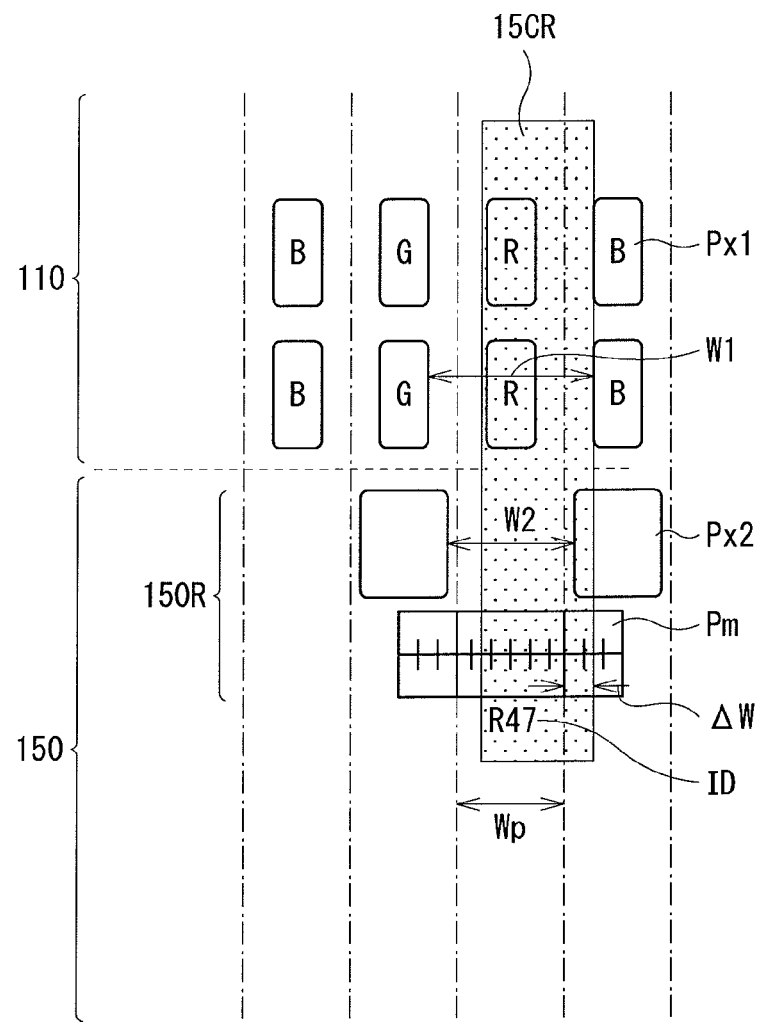
FIG. 32 is a plan view illustrating a configuration of an inspection region of an example 1.

In the inspection region 150, as illustrated in FIG. 32, on both sides of the red-light emission layer 15CR, the inspection pixels Px2 composed of the organic light-emitting elements 10G and 10B are disposed, and the distance W2 between the inspection pixels Px2 on both sides of the red-light emission layer 15CR was 120 μm, and the distance W1 between the display pixels Px1 on both sides of the red-light emission layer 15CR was 140 μm, so that the distance W2 was made to be shorter than the distance W1. The width of the inspection pixel Px2 was 80 μm, and the width of the display pixel Px1 was 50 μm. A pitch Wp (the distance from the center of the insulating layer 14 to the center) of the display pixel Px1 was 100 μm.

Further, in the inspection region 150, in addition to the inspection pixels Px2, the inspection pattern Pm with scale and the identification pattern ID were formed.

Subsequently, after completion of affixing to the sealing substrate 30, light emission nonuniformity within the effective region 110 was inspected and no light emission nonuniformity of the effective region 110 was confirmed.

Subsequently, the inspection pixel Px2 was lighted and a light-emission chromaticity was measured. In the inspection pixel Px2 formed of the organic light-emitting element 10B, a color difference from a target chromaticity became $\Delta u'v'=0.1$, greatly exceeding 0.025 that was the upper limit of the control value. Thus, it was found that the inspection pixel Px2 was mixed with the red color.

Subsequently, when the inspection pattern Pm with scale was irradiated with the light, and the transfer position was measured from an interference color of the red-light emission layer 15CR that appeared on the inspection pattern Pm with scale, it was found that the amount of a shift (protrusion) $\Delta W$ from the target position was 20 μm. The width of the red-light emission layer 15CR was 100 μm as targeted.

The identification pattern ID formed near the red-light emission layer 15CR of which misregistration was found was "R47".

Furthermore, when a similar inspection was performed for the red-light emission layer 15CR in an adjacent column, it was found that the position was shifted by 20 μm. The identification patterns ID formed near the red-light emission layer 15CR whose position was shifted were "R41" to "R48". Thus, it was found that the misregistration of the fourth head was a cause.

After the position was corrected by 20 μm for the fourth head, when on another transferred substrate 11A, the red-light emission layer 15CR was formed by the laser transfer method, and a similar inspection was performed, it was found that the transfer position was shifted to almost the target position. From the discovery of the abnormality to the adjustment of the position, there was no abnormality in a light-emission state of the effective region 110, and no failure due to the misregistration occurred.

In other words, it was found that by providing, in the inspection region 150 outside of the effective region 110, the inspection pixels Px2 composed of the organic light-emitting elements 10R, 10G and 10B, and by making the distance W2 between the inspection pixels Px2 on both sides of the color targeted for the inspection shorter than the distance W1 between the display pixels Px1 on both sides of the color targeted for the inspection, it was possible to find, based on the change in the chromaticity or the spectrum shape of the EL or PL light emission of this inspection pixel Px2, the sign such as misregistration of the red-light emission layer 15CR and the green-light emission layer 15CG at an early stage.

Module and Application Examples

In the following, application examples of the display device described in each of the above embodiments will be described. The display device of each of the embodiments can be applied to a display device of electronic apparatuses in all fields, which display externally-input video signals or internally-generated video signals as still or moving images, such as television receivers, digital cameras, laptop computers, portable terminal devices such as portable telephones, and video cameras.

Module

Figure 33:
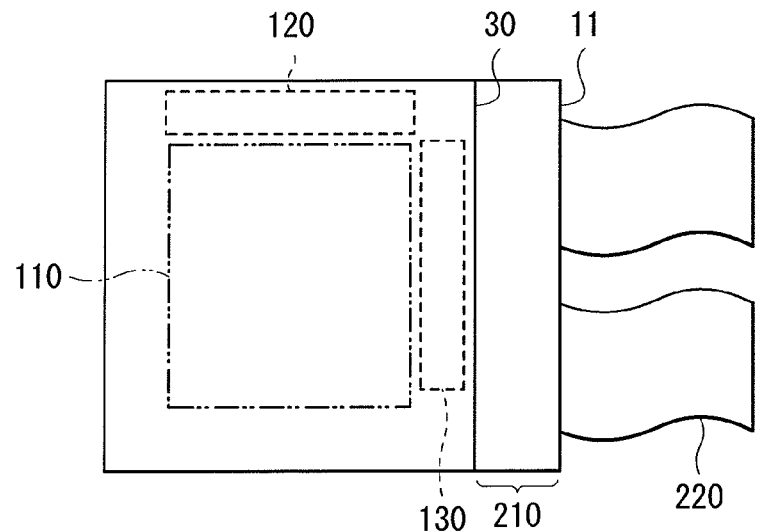
FIG. 33 is a plan view illustrating a schematic structure of a module including the display device in each of the embodiments described above.

The display device in each of the embodiments described above is, for example, incorporated into various kinds of electronic apparatus such as application examples 1 to 5 to be described later, as a module as illustrated in FIG. 33. In this module, for example, at one side of the transferred substrate 11A, an region 210 exposed from the sealing substrate 30 and the adhesive layer 20 is provided, and to this exposed region 210, wiring of the signal-line drive circuit 120 and the scanning-line drive circuit 130 is extended and therefore an external connection terminal (not illustrated) is formed. In the external connection terminal, a flexible printed circuit substrate (FPC: Flexible Printed Circuit) 220 for input and output of the signals may be provided.

Application Example 1

Figure 34:
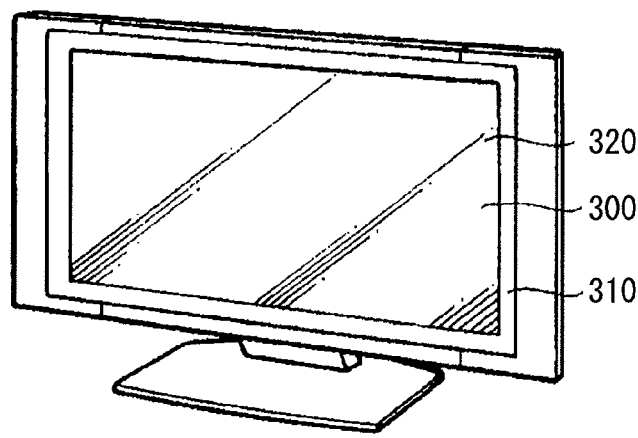
FIG. 34 is a perspective view illustrating an external appearance of an application example 1 of the display device in each of the embodiments described above.

FIG. 34 illustrates an external view of a television receiver to which the display device in each of the above-described embodiments is applied. This television receiver has, for example, a video display screen section 300 that includes a front panel 310 and a filter glass 320, and this video display screen section 300 is constructed of the display device according to each of the above-described embodiments.

Application Example 2

FIG. 35 illustrates external views of a digital camera to which the display device in each of the above-described embodiments is applied. This digital camera includes, for example, a flash emitting section 410, a display section 420, a menu switch 430, and a shutter button 440, and the display section 420 is constructed of the display device according to each of the above-described embodiments.

Application Example 3

Figure 36:
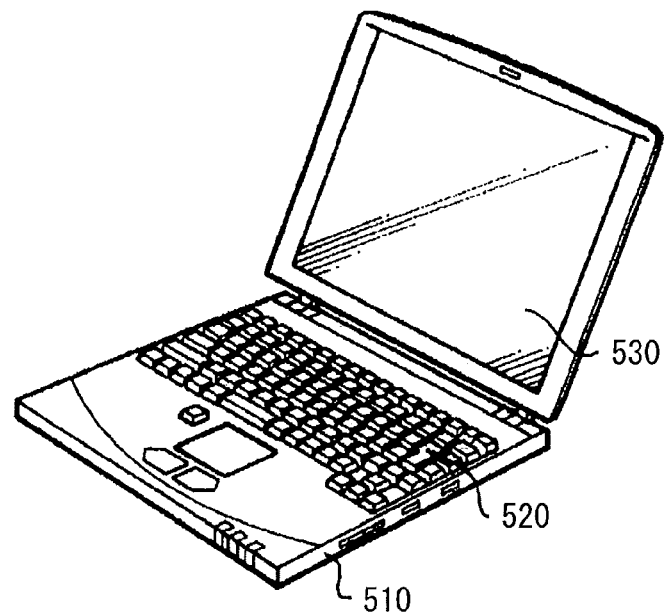
FIG. 36 is a perspective view illustrating an external appearance of an application example 3.

FIG. 36 illustrates an external view of a laptop computer to which the display device in each of the above-described embodiments is applied. This laptop computer includes, for example, a main section 510, a keyboard 520 for entering characters and the like, and a display section 530 that displays an image, and the display section 530 is constructed of the display device according to each of the above-described embodiments.

Application Example 4

Figure 37:
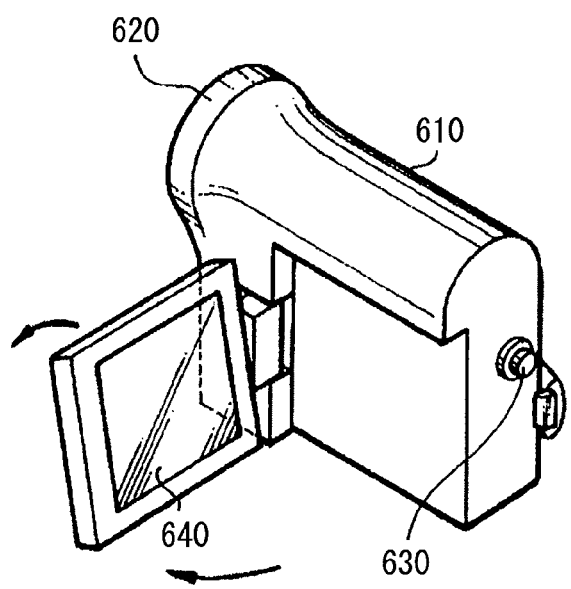
FIG. 37 is a perspective view illustrating an external appearance of an application example 4.

FIG. 37 illustrates an external view of a video camera to which the display device in each of the above-described embodiments is applied. This video camera includes, for example, a main section 610, a lens 620 disposed on a front face of this main section 610 to shoot an image of a subject, a start/stop switch 630 used at the time of shooting, and a display section 640, and the display section 640 is constructed of the display device according to each of the above-described embodiments.

Application Example 5

Figure 38:
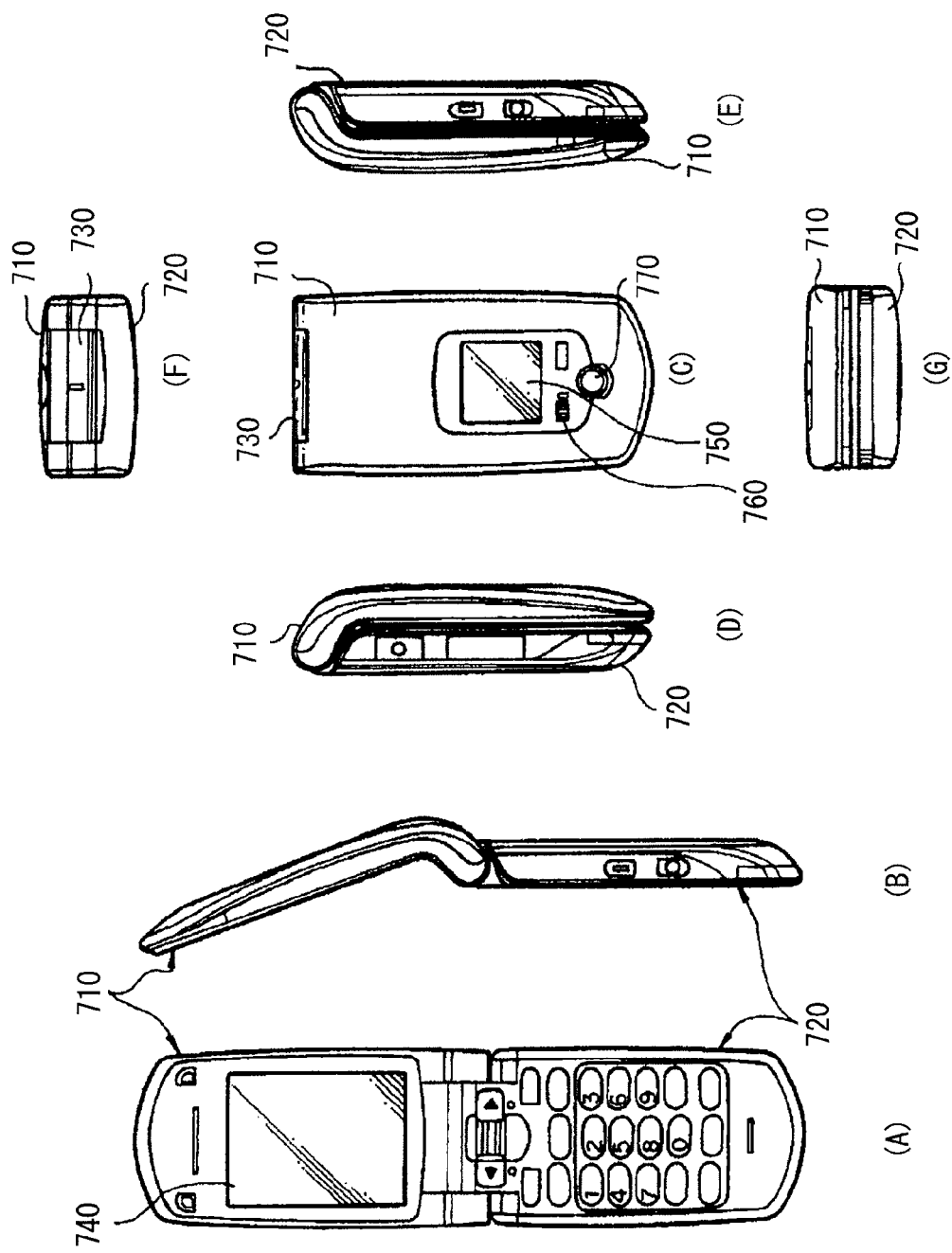
FIG. 38 is a diagram in which (A) is a front view of an application 5 in an open state, (B) is a side view thereof, (C) is a front view in a closed state, (D) is a left-side view, (E) is a right-side view, (F) is a top view, and (G) is a bottom view.
Figure 39:
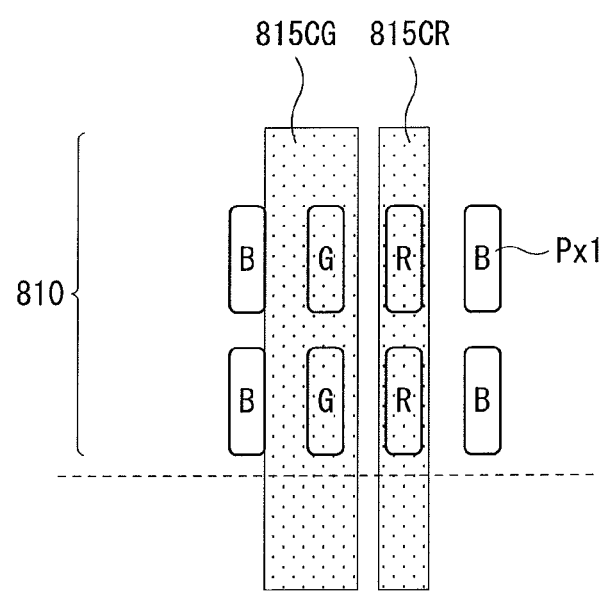
FIG. 39 is a diagram for explaining a problem of a conventional laser transfer method.

FIG. 38 illustrates external views of a portable telephone to which the display device in each of the above-described embodiments is applied. This portable telephone is, for example, a device in which an upper housing 710 and a lower housing 720 are connected by a coupling section (hinge section) 730, and includes a display 740, a sub-display 750, a picture light 760, and a camera 770. The display 740 or the sub-display 750 is constructed of the display device according to each of the above-described embodiments.

Up to this point, the present invention has been described by using the embodiments and the examples, but the present invention is not limited to the above-described embodiments and examples, and may be variously modified. For example, the embodiments and the examples have been described by using the case in which the laser beam is emitted in the transfer process, but it may be other radiation e.g. a lamp.

Further, for example, the material and thickness of each layer, the film formation method, the film formation conditions as well as the irradiation conditions of the laser beam, and the like described in the embodiments and examples are not limited, and may be other material and thickness, or may be other film formation method, other film formation conditions and irradiation conditions.

Furthermore, the embodiments has been described above by using specifically the configuration of the organic light-emitting elements 10R, 10G and 10B, but there is no need to provide all the layers, or other layer may be additionally provided. In addition, if, in the organic light-emitting elements 10R, 10G, 10B, there is formed a resonator structure in which resonance of the light emitted in the red-light emission layer 15CR, the green-light emission layer 15CG or the blue-light emission layer 15CB is produced between the first electrode 13 and the second electrode 16, it is possible to change the color of the reflected light from the inspection pattern Pt by a resonator effect.

In addition, the above-described modification 1 to the modification 8 are each applicable not only to the first embodiment, but also to the second through fourth embodiments. Moreover, the above-described modification 5 to the modification 8 are also each applicable to the fifth embodiment.

Further, each of the embodiments has been described above for the case of the active matrix type of display device, but the present invention is also applicable to a passive matrix type of display device. Furthermore, the configuration of the pixel drive circuit for the active matrix driving is not limited to that described in each of the embodiments, and a capacitor and a transistor may be added as needed. In that case, according to a change of the pixel drive circuit, a necessary drive circuit may be added, in addition to the signal-line drive circuit 120 and the scanning-line drive circuit 130.

This application is based upon and claims the benefit of priority of the prior Japanese Patent Application No. 2008-206263, filed on Aug. 8, 2008 in Japan, the contents of which are cited herein by reference.

The invention claimed is:

1. A display device comprising:
    an effective region on a substrate, the effective region including display pixels composed of organic light-emitting elements (i) formed in a matrix, and (ii) spaced from each other on both sides of a color targeted for inspection at a first distance, display pixels of a same color arranged in a same column; and
    an inspection region with inspection pixels composed of organic light-emitting elements (i) formed outside of the effective region of the substrate, and (ii) spaced from each other on both sides of the color targeted for inspection at a second distance, the second distance being shorter than the first distance,
    wherein,
        the color targeted for inspection is a color emission layer, and
        the second distance is a process control upper limit of lateral-end positions of the color targeted for inspection.

2. The display device according to claim 1, wherein the inspection pixel is provided in the same column as a column of the display pixel on each of both sides of the color targeted for inspection, and has a width wider than that of the display pixel.

3. The display device according to claim 1, wherein the inspection pixel is provided in the same column as a column of the display pixel on each of both sides of the color targeted for inspection, and a position thereof in a row direction is shifted relative to the display pixel in the same column.

4. The display device according to claim 1, wherein the shorter the wavelength of the color targeted for inspection, the farther position away from the effective region the inspection pixel is formed in.

5. The display device according to claim 1, wherein in the inspection region, an inspection pattern having a reflecting layer and a scale is formed, and the inspection pattern is formed straight in a row direction covering a column of the color targeted for inspection and at least a part of columns on both sides of the column.

6. A display device comprising:
    an effective region on a substrate, the effective region including display pixels composed of organic light-emitting elements (i) formed in a matrix, and (ii) spaced from each other on both sides of a color targeted for inspection at a first distance, the display pixels of a same color arranged in a same column; and
    an inspection region with inspection patterns including reflecting layers (i) formed outside of the effective region of the substrate, and spaced from each other on both sides of the color targeted for inspection at a second distance, the second distance being shorter than the first distance,
    wherein,
        the color targeted for inspection is a color emission layer, and
        the second distance is a process control upper limit of lateral-end positions of the color targeted for inspection.

7. A display device comprising:
    an effective region on a substrate, the effective region including display pixels composed of organic light-emitting elements formed in a matrix, the display pixels of a same color arranged in a same column; and
    an inspection region with an inspection pixel composed of an organic light-emitting element (i) formed outside of the effective region of the substrate, and (ii) in a same column as the display pixel of a color targeted for inspection, and (iii) having a width wider than that of the display pixel,
    wherein,
        the color targeted for inspection is a color emission layer, and
        the width of the inspection pixel is a process control lower limit of lateral-end positions of the color targeted for inspection.

8. A display device comprising:
    an effective region on a substrate, the effective region including display pixels composed of organic light-emitting elements formed in a matrix, the display pixels of a same color are arranged in a same column; and
    an inspection region with an inspection pattern including a reflecting layer (i) formed outside of the effective region of the substrate, and (ii) in a same column as the display pixel of a color targeted for inspection, and (iii) having a width wider than that of the display pixel,
    wherein,
        the color targeted for inspection is a color emission layer, and
        the width of the inspection pixel is a process control lower limit of lateral-end positions of the color targeted for inspection.

9. A display device comprising:
    an effective region on a substrate, the effective region including display pixels composed of organic light-emitting elements formed in a matrix, the display pixels of a same color arranged in a same column; and an inspection region with an inspection pattern including a reflecting layer and a scale formed outside of the effective region of the substrate, the inspection pattern formed in a straight row to cover a column of a color targeted for inspection and at least a part of columns on both sides of the column.

10. The display device according to claim 1, wherein the organic light-emitting element forming the display pixel has a first electrode, an organic layer including at least one of a red-light emission layer, a green-light emission layer and a blue-light emission layer, and a second electrode, sequentially, at least the red-light emission layer and the green-light emission layer are formed by a laser transfer method, and in the inspection region, on an extension of a column of the display pixel of the color targeted for inspection, an identification pattern that identifies a laser head or a laser beam used in formation of the emission layer.

11. The display device according to claim 1, further comprising:

a sealing substrate that is disposed to face a surface provided with the effective region and the inspection region of the substrate, and includes a color filter provided corresponding to the display pixel, and a shielding layer provided in a region other than the color filter and having an opening section corresponding to the inspection region.

12. The display device according to claim 1, further comprising:

a housing that accommodates the substrate and the sealing substrate, the housing having an opening section corresponding to the effective region, and a frame region provided around the opening section and covering the inspection region.

13. A method of manufacturing a display device, the method characterized by comprising:

forming first electrodes of display pixels in a matrix in an effective region of a substrate, the first electrodes of the display pixels (i) formed on both sides of a color targeted for inspection, and (ii) spaced from each other at a first distance, the color targeted for inspection being a color emission layer;

forming first electrodes of inspection pixels in an inspection region outside of the effective region, the first electrodes of the inspection pixels (i) formed on both sides of the color targeted for inspection, and (ii) spaced from each other at a second distance shorter than the first distance, the second distance being a process control upper limit of lateral-end positions of the color targeted for inspection;

forming an organic layer on the first electrodes of the display pixels and the first electrodes of the inspection pixels, the organic layer including at least one of a red-light emission layer, a green-light emission layer and a blue-light emission layer, the red-light emission layer and the green-light emission layer formed by a laser transfer method in a column to extend beyond the effective region and reach the inspection region;

forming a second electrode on the organic layer;

causing the inspection pixels to emit light by electroluminescence or photoluminescence;

measuring a chromaticity or a spectrum shape; and determining whether a position or a width of (i) the red-light emission layer, (ii) the green-light emission layer, or (iii) the blue-light emission layer is out of a specification range based on the chromaticity or the spectrum shape.

14. A method of manufacturing a display device, the method comprising:

forming first electrodes of display pixels in a matrix in an effective region of a substrate, the first electrodes of the display pixels (i) formed on both sides of a color targeted for inspection, and (ii) spaced from each other at a first distance, the color targeted for inspection being a color emission layer;

forming inspection patterns including reflecting layers in an inspection region outside of the effective region, the inspection patterns (i) formed on both sides of the color targeted for inspection, and spaced from each other at a second distance shorter than the first distance, the second distance being a process control upper limit of lateral-end positions of the color targeted for inspection;

forming an organic layer on the first electrodes, the organic layer including at least one of a red-light emission layer, a green-light emission layer and a blue-light emission layer, the red-light emission layer and the green-light emission layer formed by a laser transfer method in a column to extend beyond the effective region and reach the inspection region;

forming a second electrode on the organic layer;

irradiating the inspection patterns with light, and measuring a chromaticity, a spectrum shape of reflected light, or photoluminescence light emission; and determining whether a position or a width of (i) the red-light emission layer, (ii) the green-right emission layer, or (iii) the blue-light emission layer is out of a specification range based on the chromaticity or the spectrum shape.

15. A method of manufacturing a display device, the method characterized by comprising:

forming first electrodes of display pixels in a matrix in an effective region of a substrate, the first electrodes of the display pixels (i) formed on both sides of a color targeted for inspection, and (ii) spaced from each other at a first distance, the color targeted for inspection being a color emission layer; and forming a first electrode of an inspection pixel in an inspection region outside of the effective region and in a same column as the display pixel of the color targeted for inspection, the first electrode of the inspection pixel having a width wider than the first electrode of the display pixel, the width of the inspection pixel being a process control lower limit of lateral-end positions of the color targeted for inspection;

forming an organic layer on the first electrodes of the display pixels and the first electrode of the inspection pixel, the organic layer including at least one of a red-light emission layer, a green-light emission layer and a blue-light emission layer, the red-light emission layer and the green-light emission layer formed by a laser transfer method in a column to extend beyond the effective region and reach the inspection region;

forming a second electrode on the organic layer;

causing the inspection pixel to emit light by electroluminescence or photoluminescence;

measuring a chromaticity or a spectrum shape; and determining whether a width of (i) the red-light emission layer, (ii) the green-light emission layer, or (iii) the blue-light emission layer is out of a specification range based on the chromaticity or the spectrum shape.

16. A method of manufacturing a display device, the method comprising:
- forming first electrodes of display pixels in a matrix in an effective region of a substrate, the first electrodes of the display pixels (i) formed on both sides of a color targeted for inspection, and (ii) spaced from each other at a first distance, the color targeted for inspection being a color emission layer;
- forming an inspection pattern in an inspection region outside of the effective region, the inspection pattern including a reflecting layer in the same column as the display pixel of the color targeted for inspection, the reflecting layer having a width wider than the first electrode of the display pixel, the width of the reflecting layer being a process control lower limit of lateral-end positions of the color targeted for inspection;
- forming an organic layer on the first electrodes, the organic layer including at least one of a red-light emission layer, a green-light emission layer and a blue-light emission layer, the red-light emission layer and the green-light emission layer formed by a laser transfer method in a column to extend beyond the effective region and reach the inspection region;
- forming a second electrode on the organic layer;
- irradiating the inspection pattern with light;
- measuring a chromaticity or a spectrum shape of reflected light or photoluminescence light emission; and
- determining whether a width of (i) the red-light emission layer, (ii) the green-light emission layer, or (iii) the blue-light emission layer is out of a specification range based on the chromaticity or the spectrum shape.

17. The method of manufacturing the display device according to claim 13, wherein in the step of forming at least the red-light emission layer and the green-light emission layer by the laser transfer method, in the inspection region, on an extension of a column of the display pixel of the color targeted for inspection, an identification pattern that identifies a laser head or a laser beam used in formation of the emission layer is formed,
- the method of manufacturing the display device further comprises:
  - identifying, by using the identification pattern, in a case in which it is determined that the position or the width of the red-light emission layer, the green-light emission layer or the blue-light emission layer is out of the specification range, the laser head or the laser beam used in the step of forming the red-light emission layer, the green-light emission layer or the blue-light emission layer;
  - measuring an amount of a shift of the position or the width of the red-light emission layer, the green-light emission layer or the blue-light emission layer; and
  - correcting, based on the amount of the shift, an irradiation position or power of the laser head or the laser beam.

18. The method of manufacturing the display device according to claim 17, wherein,
- in the inspection region, an inspection pattern having a reflecting layer and a scale is formed straight in a row direction covering a column of the color targeted for inspection and at least a part of columns on both sides of the column,
- at least the red-light emission layer and the green-light emission layer are formed by the laser transfer method to intersect the inspection pattern, and
- the amount of the shift of the position or the width of the red-light emission layer, the green-light emission layer or the blue-light emission layer is measured by using the scale of the inspection pattern.

19. A method of manufacturing a display device, the method comprising:
- forming first electrodes of display pixels in a matrix in an effective region of a substrate;
- forming an inspection pattern in an inspection region outside of the effective region, the inspection region composed of a reflecting layer and having a scale in a row to cover a column of a color targeted for inspection and at least a part of columns on both sides of the column, the color targeted for inspection being a color emission layer;
- forming an organic layer on the first electrodes, the organic layer including at least one of a red-light emission layer, a green-light emission layer, and a blue-light emission layer, the red-light emission layer and the green-light emission layer formed by a laser transfer method in a column to extend beyond the effective region and reach the inspection region;
- forming a second electrode on the organic layer;
- irradiating the inspection pattern with light;
- measuring a chromaticity or a spectrum shape of reflected light or photoluminescence light emission; and
- a step of determining whether a position or a width of (i) the red-light emission layer, (ii) the green-light emission layer, or (iii) the blue-light emission layer is out of a specification range based on the chromaticity or the spectrum shape.

20. The method of manufacturing the display device according to claim 19, wherein in the step of forming at least the red-light emission layer and the green-light emission layer by the laser transfer method, in the inspection region, on an extension of a column of the display pixel of the color targeted for inspection, an identification pattern that identifies a laser head or a laser beam used in formation of the emission layer is formed,
- the method of manufacturing the display device further comprises:
  - identifying, by using the identification pattern, in a case in which it is determined that the position or the width of the red-light emission layer, the green-light emission layer or the blue-light emission layer is out of the specification range, the laser head or the laser beam used in the step of forming the red-light emission layer, the green-light emission layer or the blue-light emission layer;
- measuring an amount of a shift of the position or the width of the red-light emission layer, the green-light emission layer or the blue-light emission layer, by using the scale of the inspection pattern; and
- correcting, based on the amount of the shift, an irradiation position or power of the laser head or the laser beam.

* * * * *